US012751333B2

(12) United States Patent
Nishimura

(10) Patent No.: US 12,751,333 B2
(45) Date of Patent: Sep. 29, 2026

(54) SEMICONDUCTOR DEVICE

(71) Applicant: ROHM CO., LTD., Kyoto (JP)

(72) Inventor: Isamu Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 330 days.

(21) Appl. No.: 18/404,516

(22) Filed: Jan. 4, 2024

(65) Prior Publication Data

US 2024/0136347 A1 Apr. 25, 2024
US 2024/0234402 A9 Jul. 11, 2024

Related U.S. Application Data

(63) Continuation of application No. PCT/JP2022/024518, filed on Jun. 20, 2022.

(30) Foreign Application Priority Data

Jul. 6, 2021 (JP) ................................ 2021-112293

(51) Int. Cl.
*H10W 90/00* (2026.01)
*H10W 70/60* (2026.01)
(Continued)

(52) U.S. Cl.
CPC .......... *H10W 90/00* (2026.01); *H10W 70/611* (2026.01); *H10W 70/65* (2026.01);
(Continued)

(58) Field of Classification Search
CPC ..... H10W 90/00; H10W 90/10; H10W 90/15; H10W 70/611; H10W 72/5445;
(Continued)

(56) References Cited

U.S. PATENT DOCUMENTS 7,791,900 B2 * 9/2010 Fouquet .................. H01F 19/08 336/200
9,984,992 B2 * 5/2018 DeLaCruz .......... H01L 23/3121
(Continued)

FOREIGN PATENT DOCUMENTS

JP 2012-257421 12/2012

OTHER PUBLICATIONS

International Search Report issued in International Application No. PCT/JP2022/024518, Sep. 13, 2022, 2 pages.
(Continued)

*Primary Examiner* — Bac H Au
(74) *Attorney, Agent, or Firm* — HSML P.C.

(57) ABSTRACT

A semiconductor device includes: a first semiconductor element; a second semiconductor element; an insulating element including a first coil; a second coil magnetically coupled to the first coil; and a support substrate on which the first semiconductor element and the second semiconductor element are mounted. The support substrate includes an insulating base member, and a substrate wiring formed on the base member. The substrate wiring includes a first wiring member electrically interposed between the first semiconductor element and the first coil, and a second wiring member electrically interposed between the second semiconductor element and the second coil. The second coil is arranged between the first coil and the base member. The insulating element is supported by the support substrate.

20 Claims, 26 Drawing Sheets

(51) Int. Cl.
*H10W 70/65* (2026.01)
*H10W 72/00* (2026.01)
*H10W 72/50* (2026.01)
*H10W 72/90* (2026.01)

(52) U.S. Cl.
CPC .. *H10W 72/07554* (2026.01); *H10W 72/5445* (2026.01); *H10W 72/5449* (2026.01); *H10W 72/547* (2026.01); *H10W 72/5522* (2026.01); *H10W 72/5524* (2026.01); *H10W 72/5525* (2026.01); *H10W 72/944* (2026.01); *H10W 72/952* (2026.01); *H10W 90/753* (2026.01); *H10W 90/754* (2026.01); *H10W 90/794* (2026.01)

(58) Field of Classification Search
CPC ........... H10W 72/5449; H10W 72/547; H10W 90/753; H01F 27/2804; H01F 27/28
See application file for complete search history.

(56) References Cited

U.S. PATENT DOCUMENTS

2008/0179963 A1* 7/2008 Fouquet .................. H01F 19/08 336/200
2009/0135574 A1* 5/2009 Tanaka ................ H10W 90/701 156/60
2009/0243783 A1* 10/2009 Fouquet .................. H01F 19/08 336/200
2010/0259909 A1* 10/2010 Ho ........................ H01L 23/495 361/767
2010/0264515 A1* 10/2010 Nakashiba .......... H01L 23/5227 257/734
2011/0291819 A1* 12/2011 Kaeriyama ............. H01L 23/50 340/286.01
2013/0321094 A1* 12/2013 Sumida ............... H01L 23/5227 333/24.2
2015/0069572 A1* 3/2015 Khanolkar .......... H01F 27/2804 257/531
2015/0137314 A1* 5/2015 Osada ................... H01F 27/288 257/531
2015/0155269 A1* 6/2015 Zohni ................. H01L 25/0657 257/777
2015/0221714 A1* 8/2015 Gu ......................... H10D 1/692 257/532
2015/0318245 A1* 11/2015 Uchida ............... H01L 23/5227 257/531
2017/0005046 A1* 1/2017 Sin ........................ H01L 23/645
2017/0053846 A1* 2/2017 Katsura ............... H01L 25/0655
2017/0125393 A1* 5/2017 Kwon ..................... H01L 25/18
2020/0027836 A1* 1/2020 Takano ................... H01L 23/16
2021/0183844 A1* 6/2021 Cheng ..................... H01L 25/18
2021/0391265 A1* 12/2021 Jung ................... H01L 23/5383
2022/0077081 A1* 3/2022 Kurita ................... H01L 23/645
2022/0102264 A1* 3/2022 Yoshihara ........... H01L 23/3735
2022/0270988 A1* 8/2022 Nishimura ............... H10D 1/20
2022/0302008 A1* 9/2022 Yen ....................... H01L 25/105
2022/0352109 A1* 11/2022 Yu ....................... H01L 25/0655
2023/0317684 A1* 10/2023 Beyer ................. H01L 23/3735 257/723

OTHER PUBLICATIONS

Written Opinion issued in International Application No. PCT/JP2022/024518, Sep. 13, 2022, 2 pages.

* cited by examiner

SEMICONDUCTOR DEVICE

TECHNICAL FIELD

The present disclosure relates to a semiconductor device.

BACKGROUND ART

Some semiconductor devices are used to drive a switching element such as an insulated gate bipolar transistor (IGBT) or a metal oxide semiconductor field effect transistor (MOSFET). JP-A-2012-257421 discloses an example of such a semiconductor device (switch control device). The switch control device described in JP-A-2012-257421 includes a first semiconductor chip, a second semiconductor chip, a third semiconductor chip, a first island, and a second island. The first semiconductor chip is a controller chip having a controller integrated therein, where the controller generates a switch control signal according to an input signal. The second semiconductor chip is a driver chip having a driver integrated therein, where the driver controls the drive of a switch according to the switch control signal inputted from the first semiconductor chip via the third semiconductor chip. A higher source voltage is applied to the second semiconductor chip than to the first semiconductor chip. The third semiconductor chip is a transformer chip having a transformer integrated therein, where the transformer transfers the switch control signal and so on, while insulating the direct current between the first semiconductor chip and the second semiconductor chip. The first semiconductor chip and the third semiconductor chip are mounted on the first island, and the second semiconductor chip is mounted on the second island. In the switch control device described in JP-A-2012-257421, the first island and the second island are spaced apart from each other to separate the power supply systems, where the first island serves as a low-voltage island and the second island serves as a high-voltage island.

DETAILED DESCRIPTION OF EMBODIMENTS

Figure 1:
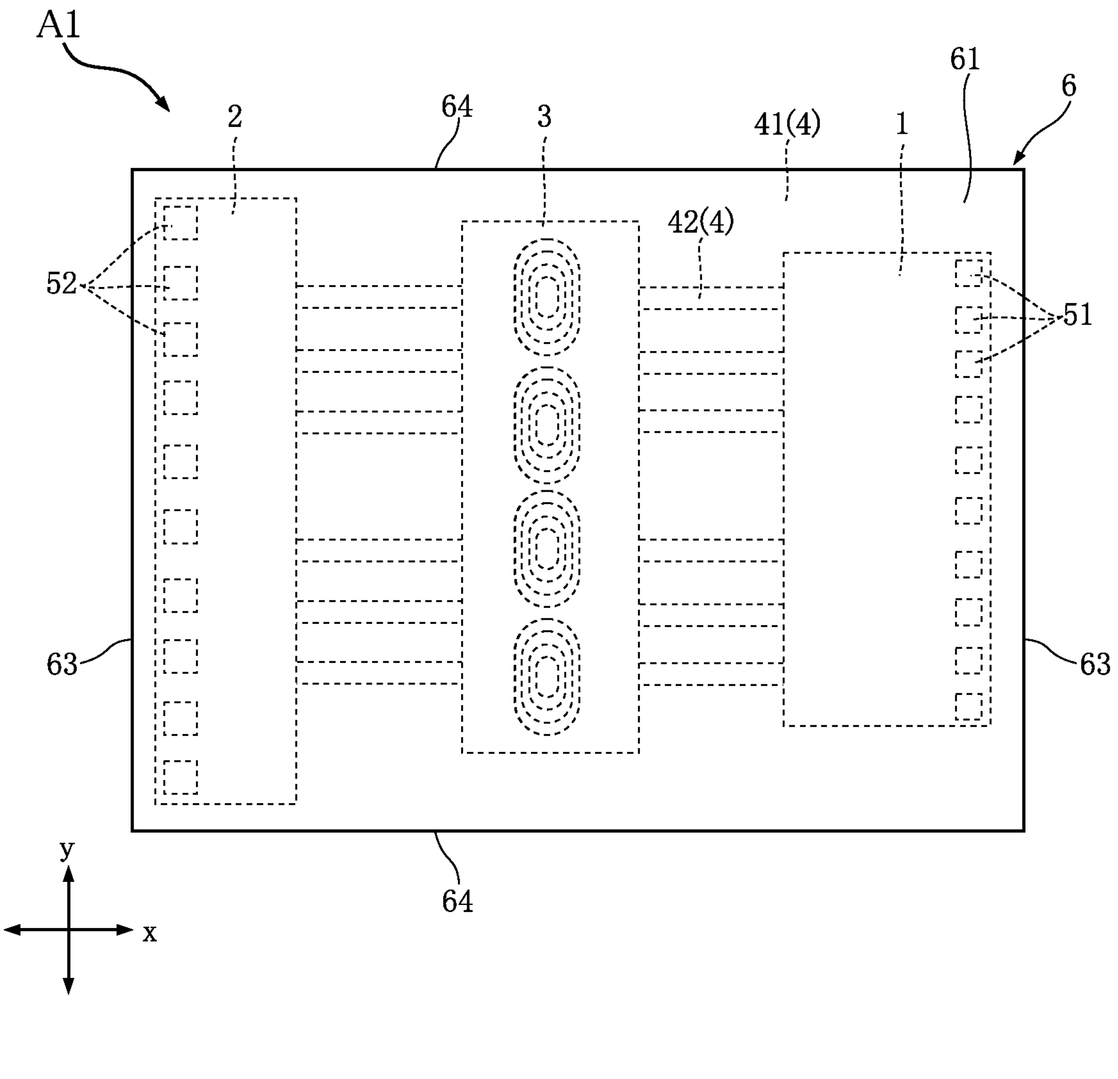
FIG. 1 is a plan view showing a semiconductor device according to a first embodiment.

The following describes the preferred embodiments of a semiconductor device according to the present disclosure with reference to the accompanying drawings. In the description given below, the same or similar elements are denoted by the same reference numerals, and the descriptions thereof are omitted. In the present disclosure, the terms “first”, “second”, “third” etc., are used merely as labels and are not necessarily intended to impose orders on the items to which these terms refer.

In the present disclosure, the phrases “an object A is formed in an object B” and “an object A is formed on an object B” include, unless otherwise specified, “an object A is formed directly in/on an object B” and “an object A is formed in/on an object B with another object interposed between the object A and the object B”. Similarly, the phrases "an object A is disposed in an object B" and "an object A is disposed on an object B" include, unless otherwise specified, "an object A is disposed directly in/on an object B" and "an object A is disposed in/on an object B with another object interposed between the object A and the object B". Similarly, the phrase "an object A is located on an object B" includes, unless otherwise specified, "an object A is located on an object B in contact with the object B" and "an object A is located an object B with another object interposed between the object A and the object B". Furthermore, the phrase "an object A overlaps with an object B as viewed in a certain direction" includes, unless otherwise specified, "an object A overlaps with the entirety of an object B" and "an object A overlaps with a portion of an object B".

FIGS. 1 to 12 show a semiconductor device A1 according to a first embodiment. The semiconductor device A1 is surface-mountable on a circuit board of an inverter in, for example, an electric vehicle or a hybrid vehicle. The semiconductor device A1 includes a first semiconductor element 1, a second semiconductor element 2, an insulating element 3, a support substrate 4, a plurality of first external terminals 51, a plurality of second external terminals 52, and a sealing resin 6. In the semiconductor device A1, the insulating element 3 includes a first coil L1 and a second coil L2 that are magnetically coupled to each other.

For convenience of explanation, the thickness direction of the semiconductor device A1 is referred to as "thickness direction z". In the present disclosure, "plan view" refers to the view seen in the thickness direction z. A direction perpendicular to the thickness direction z is referred to as "first direction x". The direction perpendicular to the thickness direction z and the first direction x is referred to as "second direction y".

Figure 2:
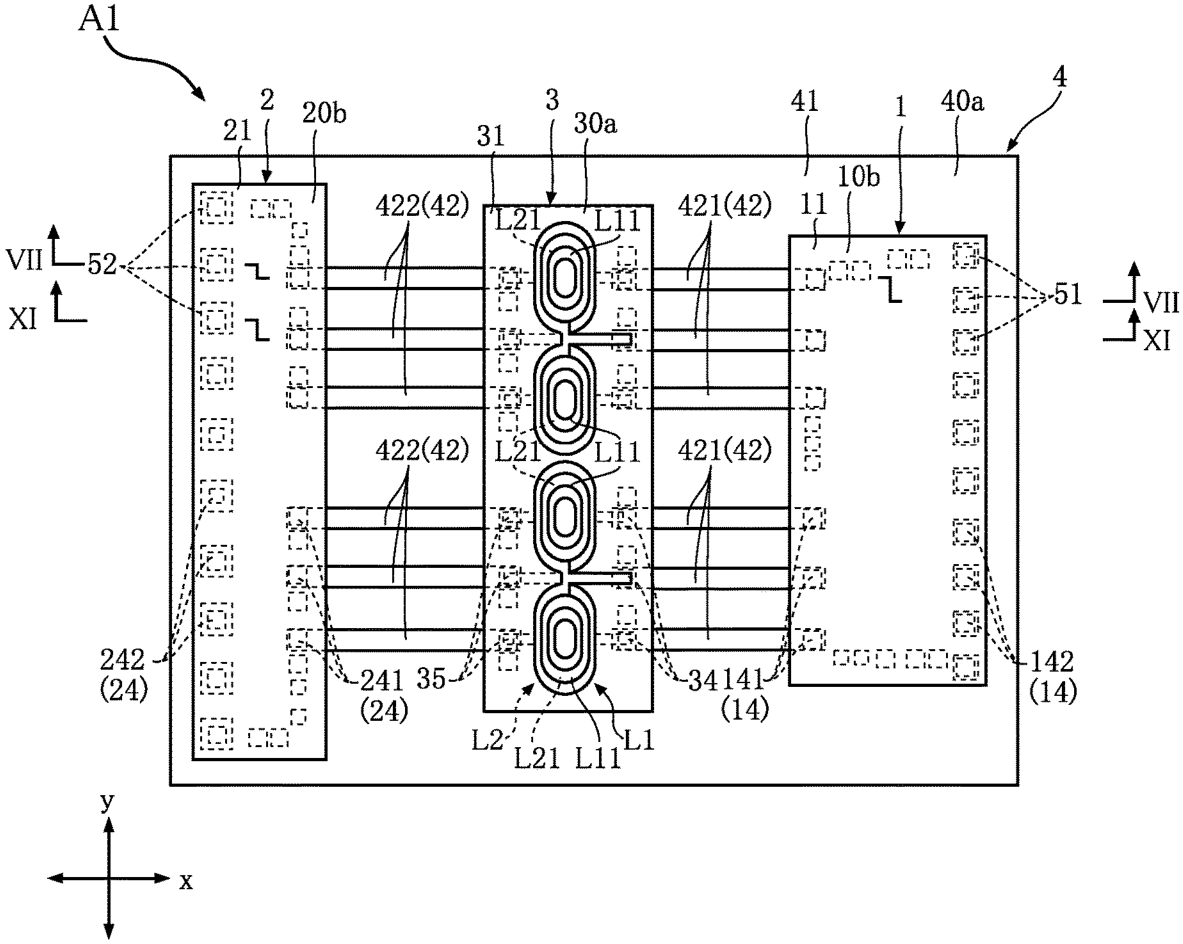
FIG. 2 is a plan view similar to FIG. 1, from which a sealing resin is omitted.
Figure 3:
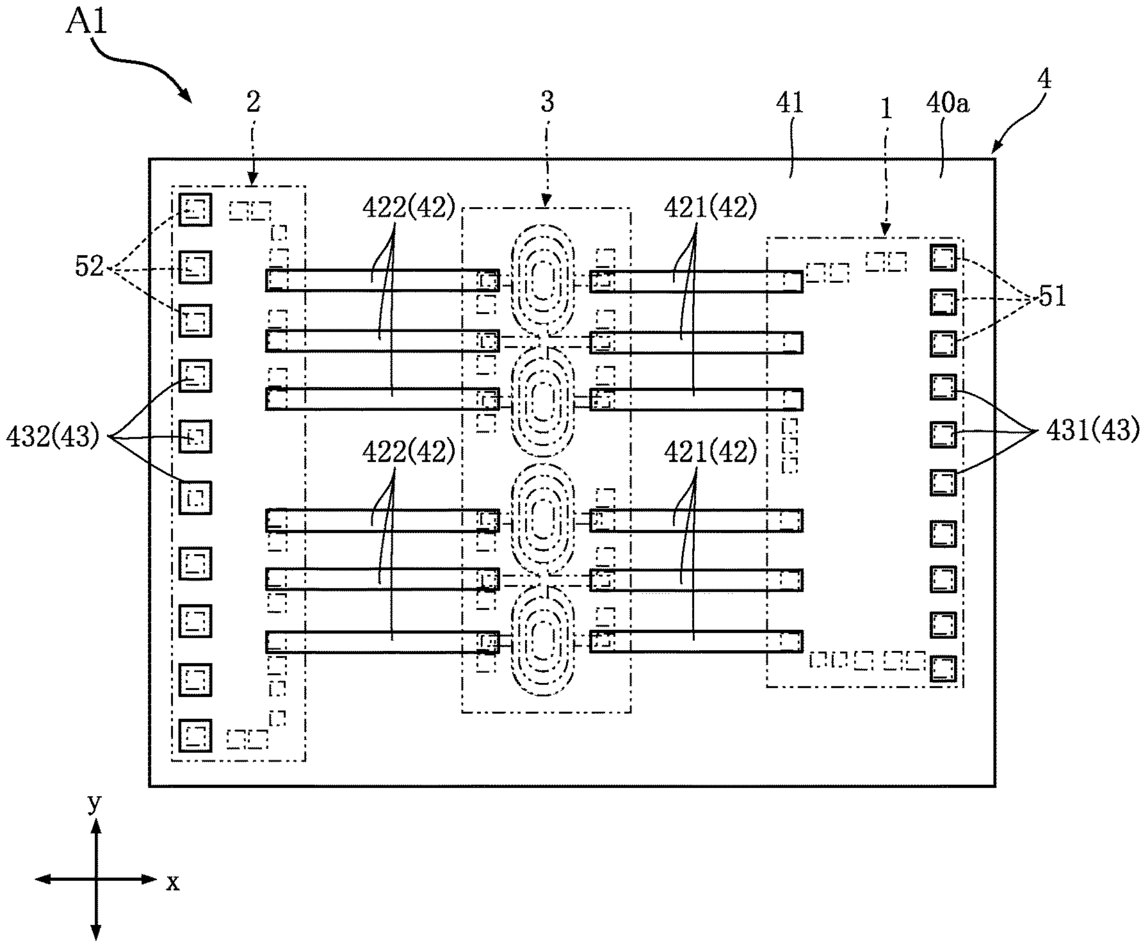
FIG. 3 is a plan view similar to FIG. 2, with a first semiconductor element, a second semiconductor element, and an insulating element indicated by imaginary lines.
Figure 4:
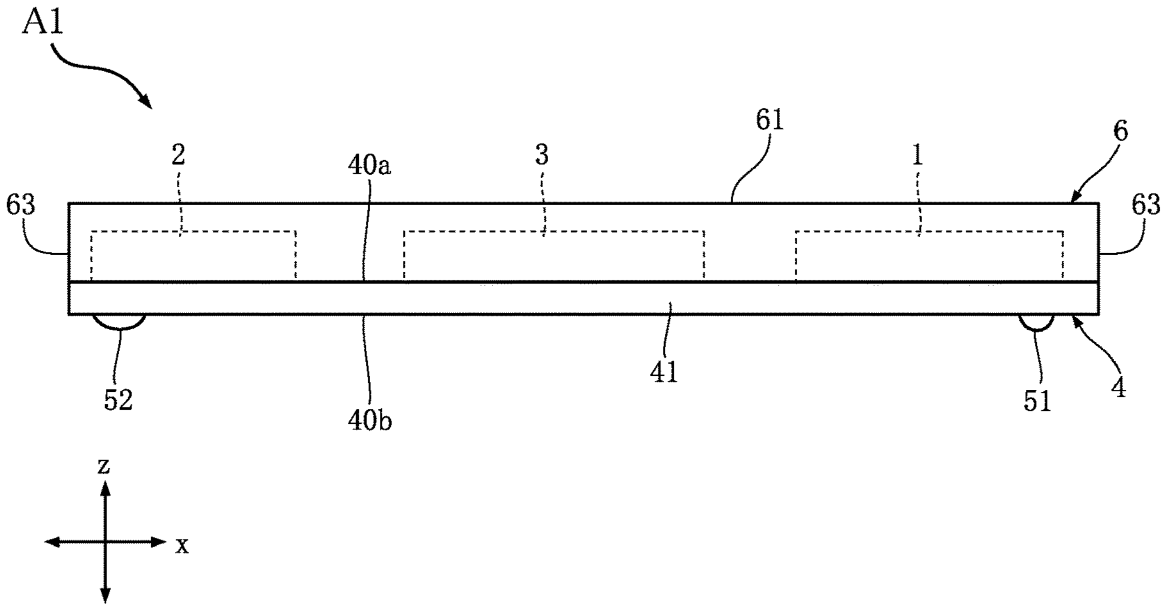
FIG. 4 is a front view showing the semiconductor device according to the first embodiment.
Figure 5:
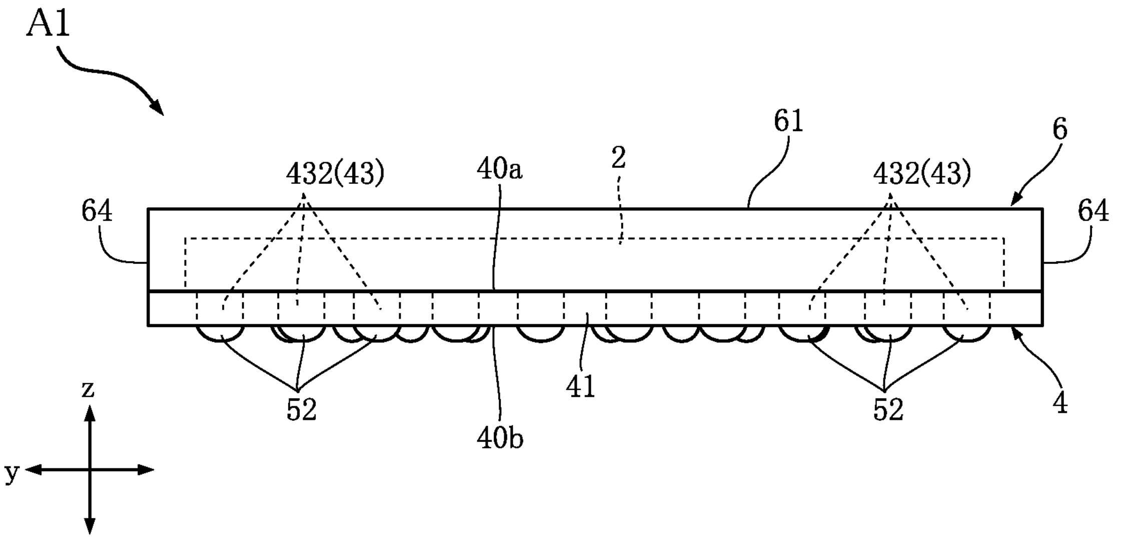
FIG. 5 is a left-side view showing the semiconductor device according to the first embodiment.
Figure 6:
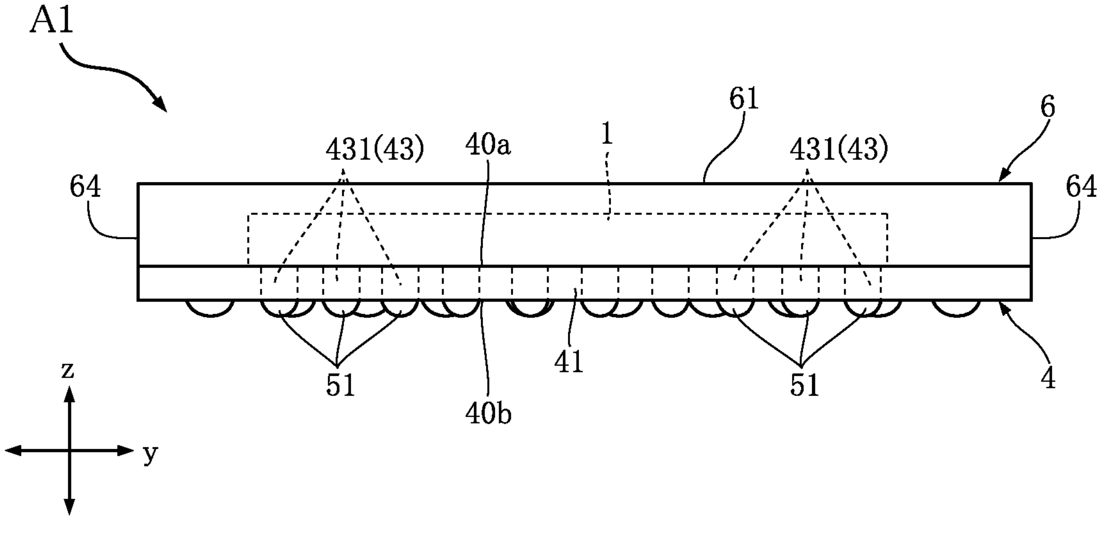
FIG. 6 is a right-side view showing the semiconductor device according to the first embodiment.

The first semiconductor element 1, the second semiconductor element 2, and the insulating element 3 form the functional core of the semiconductor device A1. As shown in FIGS. 1 to 4 and FIGS. 7 to 11, the first semiconductor element 1, the second semiconductor element 2, and the insulating element 3 are individual elements. As shown in FIGS. 1 to 3, each of the first semiconductor element 1, the second semiconductor element 2, and the insulating element 3 has a rectangular shape elongated in the second direction y in plan view. However, the plan-view shape of each of these elements is not limited to the illustrated example.

The first semiconductor element 1 is a drive element (e.g., a gate driver) for driving a switching element such as an IGBT or a MOSFET. The first semiconductor element 1 includes a first functional circuit. For example, the first functional circuit includes a reception circuit that receives a PWM control signal, a circuit that controls the drive of a switching element according to the PWM signal, a transmission circuit that transmits an electric signal to the second semiconductor element 2 via the insulating element 3. The electric signal may be an output signal from a temperature sensor arranged near a motor. As shown in FIGS. 1 to 4, 7, 8 and 11, the first semiconductor element 1 is mounted on a support substrate 4.

Figure 8:
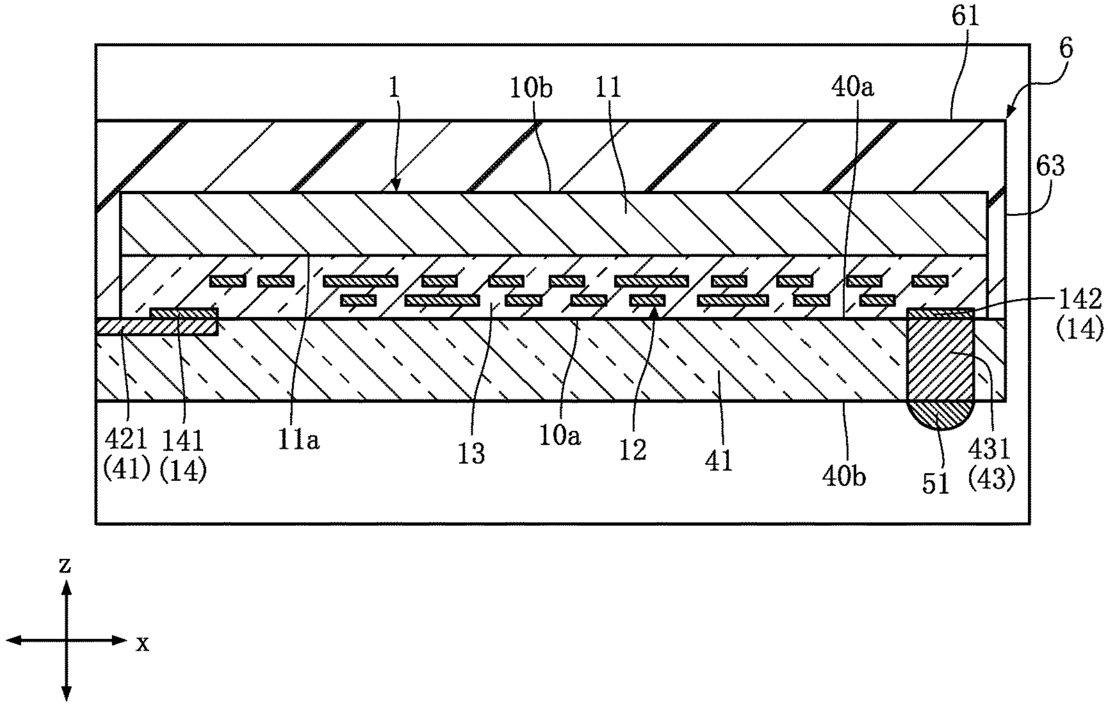
FIG. 8 is a partially enlarged cross-sectional view showing a portion (near the first semiconductor element) of FIG. 7.

The first semiconductor element 1 has a first element obverse surface 10*a* and a first element reverse surface 10*b*. The first element obverse surface 10*a* and the first element reverse surface 10*b* are spaced apart from each other in the thickness direction z. As shown in FIG. 8, the first element obverse surface 10*a* faces downward in the thickness direction z and faces the support substrate 4. The first element reverse surface 10*b* faces upward in the thickness direction z. The first element obverse surface 10*a* and the first element reverse surface 10*b* are flat.

Figure 7:
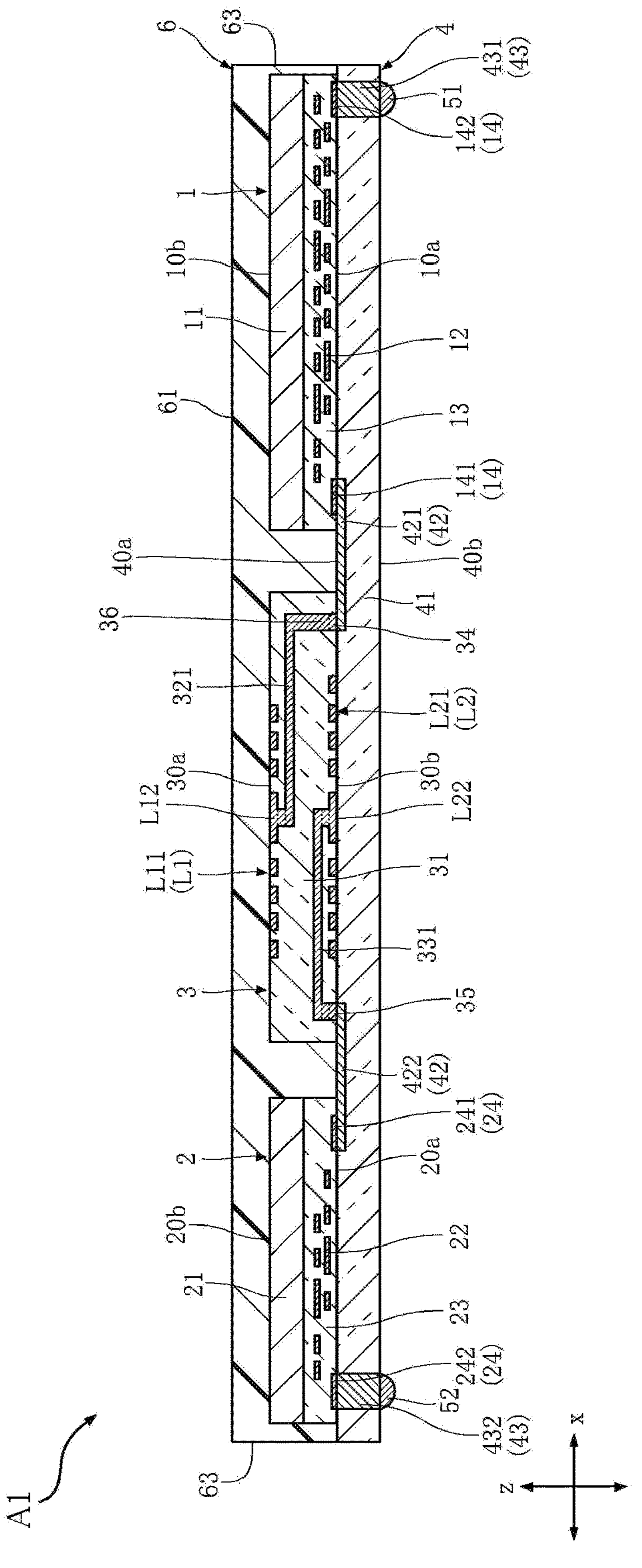
FIG. 7 is a cross-sectional view taken along line VII-VII in FIG. 2.
Figure 11:
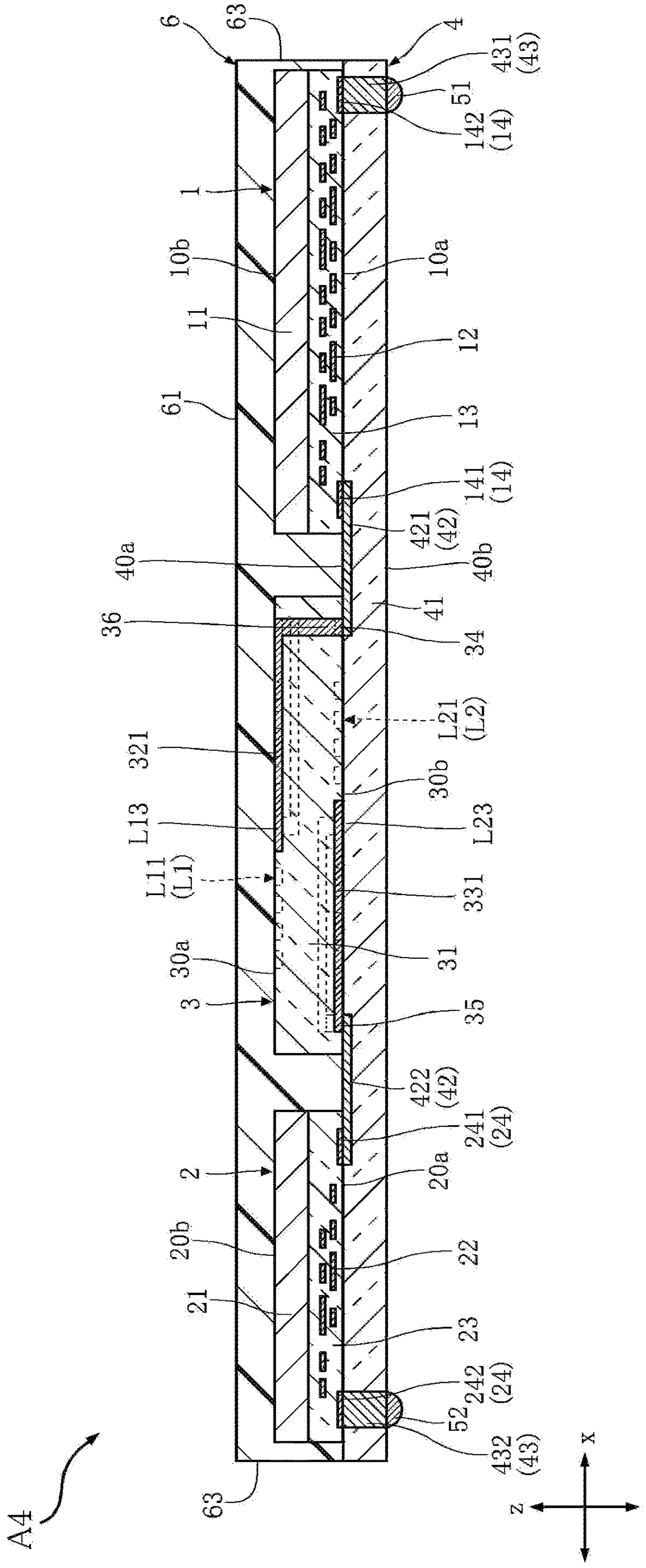
FIG. 11 is a cross-sectional view taken along line XI-XI in FIG. 2.

As shown in FIGS. 7, 8 and 11, the first semiconductor element 1 includes a first substrate 11, a first wiring layer 12, a first insulating layer 13, and a plurality of first pads 14.

As shown in FIG. 8, the first substrate 11 has a first functional surface 11*a* on which the first functional circuit, which is described above, is formed. The first functional surface 11*a* faces downward in the thickness direction z. The first substrate 11 may contain a semiconductor material such as silicon (Si), silicon carbide (SiC), gallium arsenide (GaAs), gallium nitride (GaN), or indium phosphide (InP).

As shown in FIG. 8, the first wiring layer 12 is formed on the first functional surface 11*a*. The first wiring layer 12 is electrically connected to the first functional circuit. In the example shown in FIGS. 7, 8 and 11, the first wiring layer 12 has a two-layer structure. Instead, the first wiring layer 12 may include three or more layers, or may have a single-layer structure. The constituent material of the first wiring layer 12 is copper (Cu) or a Cu alloy, for example.

As shown in FIG. 8, the first insulating layer 13 is stacked on the first functional surface 11*a*. As shown in FIGS. 7, 8 and 11, the first insulating layer 13 covers the first wiring layer 12. The first insulating layer 13 may contain glass as a constituent material, and the glass contains silicon dioxide ($SiO_2$), for example.

As shown in FIG. 8, the first pads 14 are provided on the first element obverse surface 10*a*. Each of the first pads 14 is electrically connected to the first functional circuit via the first wiring layer 12. The constituent material of the first pads 14 is Cu or a Cu alloy, for example. The constituent material may not be either Cu or a Cu alloy, but may be aluminum (A1) or an A1 alloy. As shown in FIGS. 2, 7, 8 and 11, the first pads 14 include a plurality of electrodes 141 and a plurality of electrodes 142. As will be understood from the configuration described below, the electrodes 141 are electrically connected to a first coil L1 of the insulating element 3, and the electrodes 142 are electrically connected to a plurality of first external terminals 51. As shown in FIGS. 2, 7 and 11, the electrodes 141 are located near the insulating element 3 than the electrodes 142 in the first direction x.

As shown in FIG. 8, the first insulating layer 13 and the first pads 14 (the electrodes 141 and 142) of the first semiconductor element 1 are exposed from the first element obverse surface 10*a*. In the semiconductor device A1, the first element obverse surface 10*a* faces downward in the thickness direction z. Accordingly, the first insulating layer 13 and the first pads 14 are exposed from the lower surface (the surface facing downward in the thickness direction z) of the first semiconductor element 1. The surface of the first insulating layer 13 located downward in the thickness direction z is flush with the surfaces of the first pads 14 located downward in the thickness direction z. For example, these surfaces will be flush with each other by mirror-finishing the first element obverse surface 10. The first element obverse surface 10*a* is constituted of the surface of the first insulating layer 13 located downward in the thickness direction z and the surfaces of the first pads 14 located downward in the thickness direction z. The first element reverse surface 10*b* is constituted of the surface of the first substrate 11 located upward in the thickness direction z.

The second semiconductor element 2 is a control element (e.g., the controller of a gate driver) for controlling the drive of the switching element described above. The second semiconductor element 2 includes a second functional circuit. For example, the second functional circuit includes a circuit that converts a control signal inputted from the ECU or the like to a PWM signal, a transmission circuit that transmits the PWM signal to the insulating element 3, and a reception circuit that receives an electric signal from the first semiconductor element 1 via the insulating element 3. As shown in FIGS. 1 to 4, 7, 9 and 11, the second semiconductor element 2 is mounted on the support substrate 4.

Figure 9:
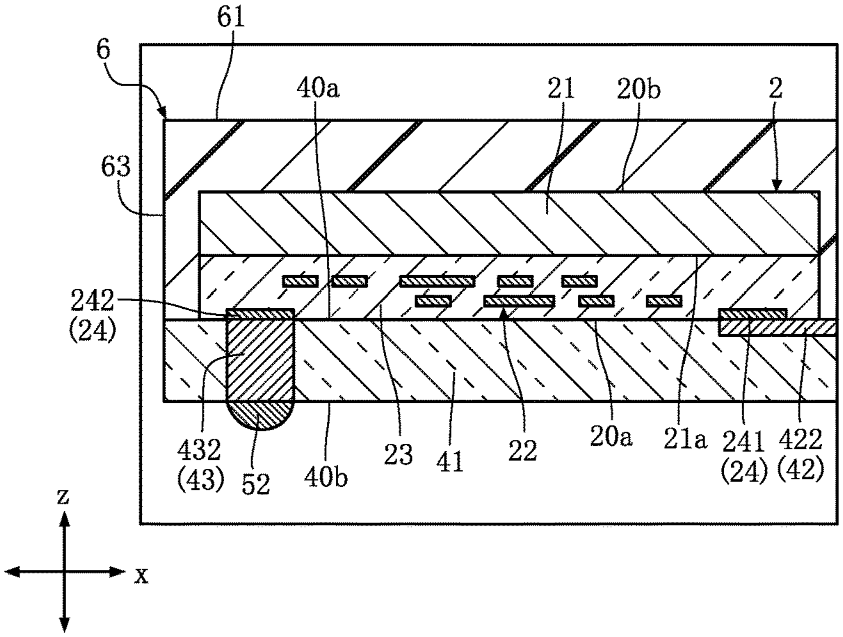
FIG. 9 is a partially enlarged cross-sectional view showing a portion (near the second semiconductor element) of FIG. 7.

The second semiconductor element 2 has a second element obverse surface 20*a* and a second element reverse surface 20*b*. The second element obverse surface 20*a* and the second element reverse surface 20*b* are spaced apart from each other in the thickness direction z. As shown in FIG. 9, the second element obverse surface 20*a* faces downward in the thickness direction z and faces the support substrate 4. The second element reverse surface 20*b* faces upward in the thickness direction z. The second element obverse surface 20*a* and the second element reverse surface 20*b* are flat.

As shown in FIGS. 7, 9 and 11, the second semiconductor element 2 includes a second substrate 21, a second wiring layer 22, a second insulating layer 23, and a plurality of second pads 24.

As shown in FIG. 9, the second substrate 21 has a second functional surface 21*a* on which the second functional circuit, which is described above, is formed. The second functional surface 21*a* faces downward in the thickness direction z. The second substrate 21 may contain a semiconductor material such as Si, SiC, GaAs, GaN, or InP.

As shown in FIG. 9, the second wiring layer 22 is formed on the second functional surface 21*a*. The second wiring layer 22 is electrically connected to the second functional circuit. In the example shown in FIGS. 7, 9 and 11, the second wiring layer 22 has a two-layer structure. Instead, the second wiring layer 22 may include three or more layers, or may have a single-layer structure. The constituent material of the second wiring layer 22 is Cu or a Cu alloy, for example.

As shown in FIG. 9, the second insulating layer 23 is stacked on the second functional surface 21*a*. As shown in FIGS. 7, 9 and 11, the second insulating layer 23 covers the second wiring layer 22. The second insulating layer 23 may contain glass as a constituent material, and the glass contains $SiO_2$, for example.

As shown in FIG. 9, the second pads 24 are provided on the second element obverse surface 20*a*. Each of the second pads 24 is electrically connected to the second functional circuit via the second wiring layer 22. The constituent material of the second pads 24 is Cu or a Cu alloy, for example. The constituent material may not be either Cu or a Cu alloy, but may be Al or an Al alloy. As shown in FIGS. 2, 7, 9 and 11, the second pads 24 include a plurality of electrodes 241 and a plurality of electrodes 242. As will be understood from the configuration described below, the electrodes 241 are electrically connected to a second coil L2 of the insulating element 3, and the electrodes 242 are electrically connected to a plurality of second external terminals 52. As shown in FIGS. 2, 7 and 11, the electrodes 241 are located near the insulating element 3 than the electrodes 242 in the first direction x.

As shown in FIG. 9, the second insulating layer 23 and the second pads 24 (the electrodes 241 and 242) of the second semiconductor element 2 are exposed from the second element obverse surface 20*a*. In the semiconductor device A1, the second element obverse surface 20*a* faces downward in the thickness direction z. Accordingly, the second insulating layer 23 and the second pads 24 are exposed from the lower surface (the surface facing downward in the thickness direction z) of the second semiconductor element 2. The surface of the second insulating layer 23 located downward in the thickness direction z is flush with the surfaces of the second pads 24 located downward in the thickness direction z. For example, these surfaces will be flush with each other by mirror-finishing the second element obverse surface 20*a*. The second element obverse surface 20*a* is constituted of the surface of the second insulating layer 23 located downward in the thickness direction z and the surfaces of the second pads 24 located downward in the thickness direction z. The second element reverse surface 20*b* is constituted of the surface of the second substrate 21 located upward in the thickness direction z.

The insulating element 3 is an element for transmitting the PWM control signal and other electric signals in an insulated state. The insulating element 3 is of an inductor-coupled type, for example. An example of the inductor-coupled insulating element is an insulating transformer. The insulating element 3 in the semiconductor device A1 transmits an electric signal in an insulated state by inductively coupling two inductors (the first coil L1 and the second coil L2). As shown in FIGS. 1 to 4, 7, 10 and 11, the insulating element 3 is mounted on the support substrate 4. As a result, the insulating element 3 is supported by the support substrate 4. As shown in FIGS. 1 to 4, 7 and 11, the insulating element 3 is located between the first semiconductor element 1 and the second semiconductor element 2 in the first direction x.

In the semiconductor device A1, the second semiconductor element 2 requires a higher voltage than the first semiconductor element 1. In the case of an inverter for an electric vehicle or a hybrid vehicle, the source voltage required for the second semiconductor element 2 is approximately 0 V to 5 V, whereas the voltage required for the first semiconductor element 1 is 600 V or higher. In this example, a significant potential difference is created between the first semiconductor element 1 and the second semiconductor element 2, and therefore a first circuit including the first semiconductor element 1 and a second circuit including the second semiconductor element 2 are insulated from each other by the insulating element 3. In other words, the insulating element 3 insulates the first circuit that includes the first semiconductor element 1 having a relatively high voltage from the second circuit that includes the second semiconductor element 2 having a relatively low voltage.

Figure 10:
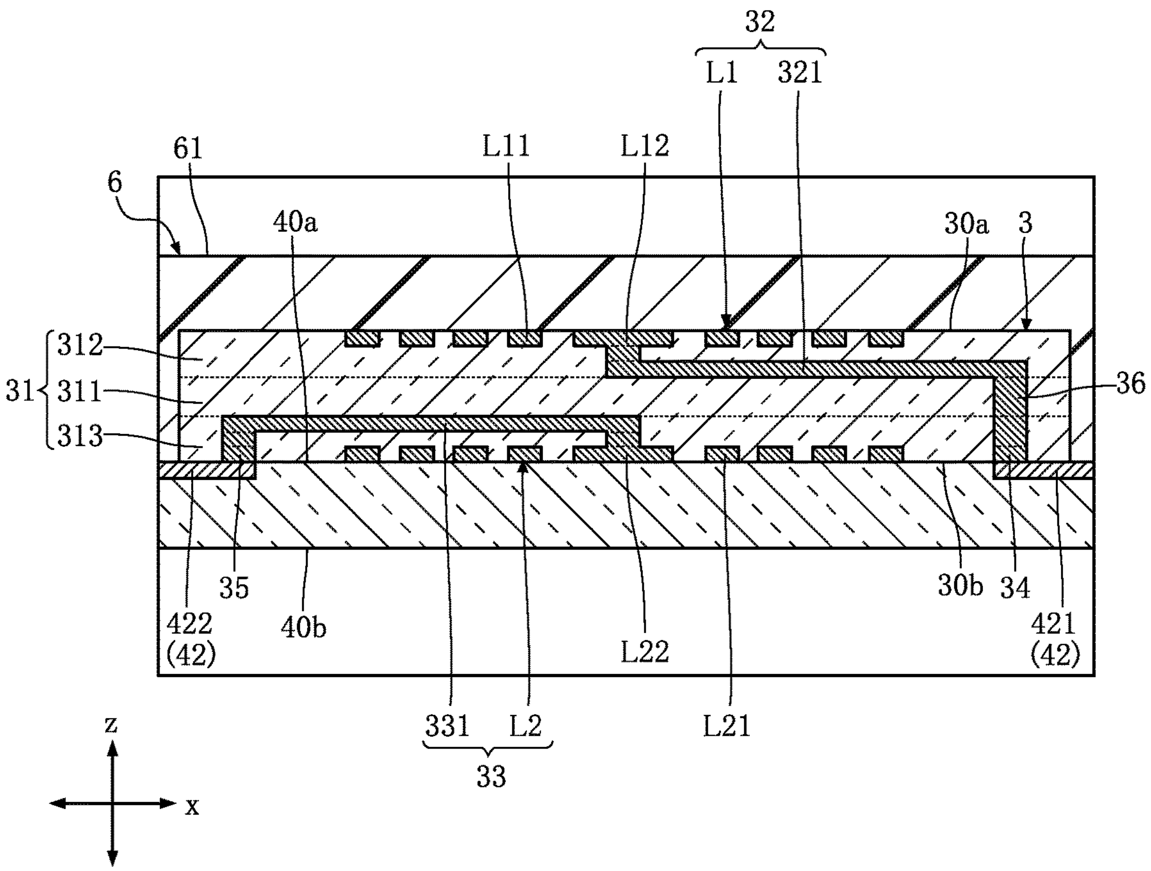
FIG. 10 is a partially enlarged cross-sectional view showing a portion (near the insulating element) of FIG. 7.

As shown in FIGS. 7, 10 and 11, the insulating element 3 has a third element obverse surface 30*a* and a third element reverse surface 30*b*. The third element obverse surface 30*a* and the third element reverse surface 30*b* are spaced apart from each other in the thickness direction z. As shown in FIGS. 7, 10 and 11, the third element obverse surface 30*a* faces upward in the thickness direction z. The third element reverse surface 30*b* faces downward in the thickness direction z and faces the support substrate 4. The third element obverse surface 30*a* and the third element reverse surface 30*b* are flat.

As shown in FIGS. 7, 10 to 12, the insulating element 3 includes a third insulating layer 31, an upper wiring layer 32, a lower wiring layer 33, a plurality of third pads 34, a plurality of fourth pads 35, and a plurality of connecting wires 36.

Figure 12:
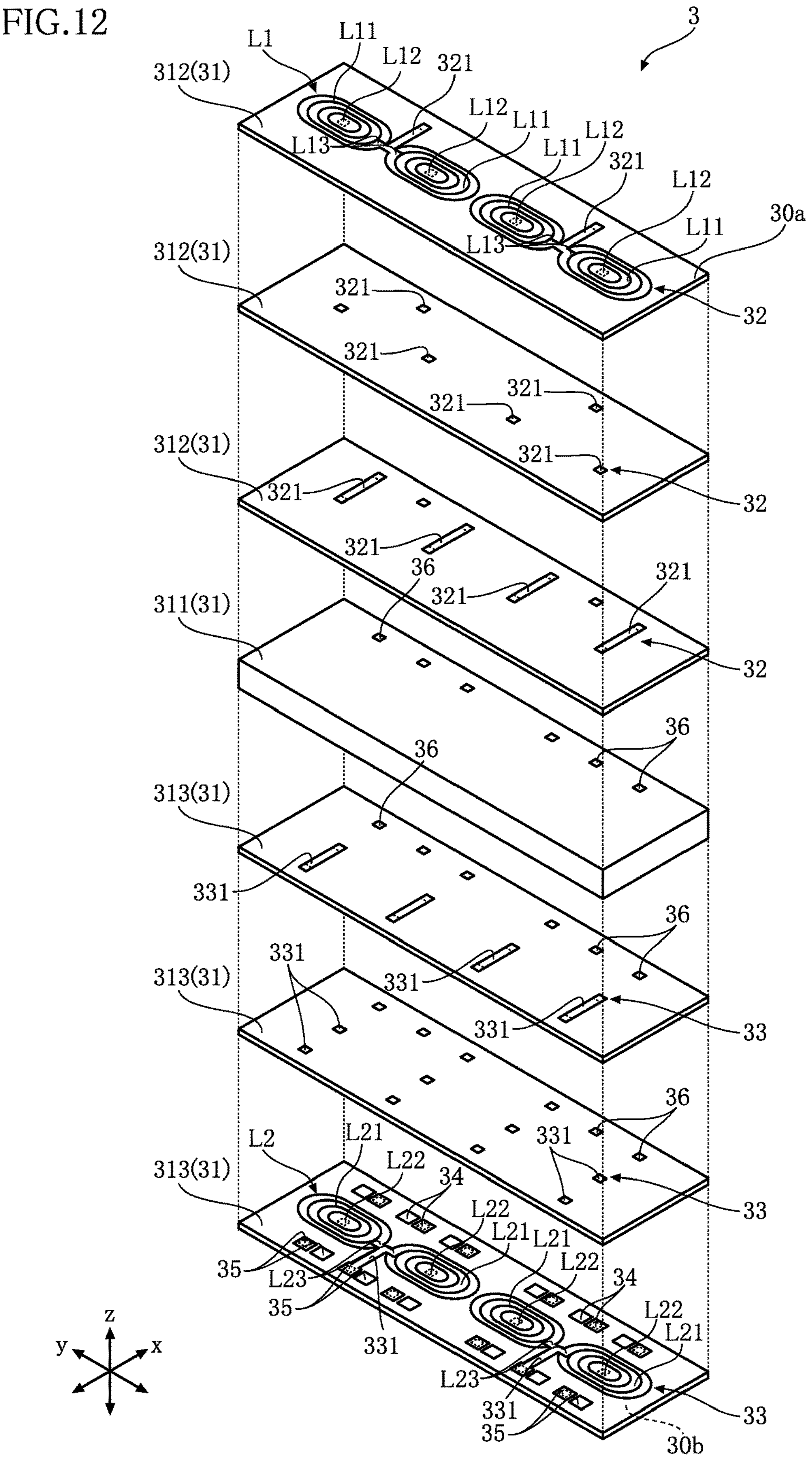
FIG. 12 is an exploded perspective view showing an example configuration of the insulating element.

The third insulating layer 31 may contain glass as a constituent material, and the glass contains $SiO_2$, for example. As shown in FIGS. 10 and 12, the third insulating layer 31 includes an intermediate portion 311, an upper covering portion 312, and a lower covering portion 313. As shown in FIG. 10, the intermediate portion 311 is provided between the upper wiring layer 32 and the lower wiring layer 33 in the thickness direction z. The upper covering portion 312 is located on the intermediate portion 311 in the thickness direction z, and covers the upper wiring layer 32. The lower covering portion 313 is located under the intermediate portion 311 in the thickness direction z, and covers the lower wiring layer 33.

As shown in FIG. 10, the upper wiring layer 32 is formed above the intermediate portion 311 in the thickness direction z. The upper wiring layer 32 includes the first coil L1 and a plurality of lead wires 321.

As shown in FIGS. 10 and 12, the first coil L1 is provided on the third element obverse surface 30*a*. As shown in FIGS. 10 and 12, the first coil L1 includes a plurality of winding portions L11. In the illustrated example, the first coil L1 includes four winding portions L11. The number of winding portions L11 is not limited to four, and may be changed appropriately according to the specifications of the semiconductor device A1. Each of the winding portions L11 is wound along a plane (x-y plane) perpendicular to the thickness direction z. Each of the winding portions L11 is wound in a spiral. In the example shown in FIG. 2, each of the winding portions L11 is wound in an ellipse in plan view. Alternatively, each of the winding portions L11 may be wound in a circle or a rectangle. The winding portions L11 are arranged in the second direction y.

As shown in FIG. 7 and FIGS. 10 to 12, each of the winding portions L11 has an inner end L12 and an outer end L13. The inner end L12 is the end of the winding portion L11 located inside, and the outer end L13 is the end of the winding portion L11 located outside. In plan view, the inner end L12 is located at the center of the winding portion L11. In the illustrated example, the inner end L12 overlaps with the winding axis of the winding portion L11 in plan view. Each winding portion L11, starting from the inner end L12, extends along a predetermined trajectory for the winding portion L11 and reaches the outer end L13. One of the inner end L12 and the outer end L13 is a current input end of the winding portion L11, and the other is a current output end of the winding portion L11.

The lead wires 321 electrically connect the winding portions L11 to each other in the upper wiring layer 32, and electrically connect the winding portions L11 to the connecting wires 36. As shown in FIG. 7 and FIGS. 10 to 12, the lead wires 321 include: one that is connected to the outer ends L13 of the two winding portions L11 arranged in one sense of the second direction y, and that is connected to one of the connecting wires 36; one that is connected to the outer ends L13 of the two winding portions L11 arranged in the other sense of the second direction y and, and that is connected to one of the connecting wires 36; and those that are connected to the inner ends L12 of the winding portions L11 and the connecting wires 36. As shown in FIG. 12, some of the lead wires 321 are located below the first coil L1 (the winding portions L11) in the thickness direction z and between the first coil L1 (the winding portions L11) and the intermediate portion 311. Unlike this configuration, however, they may be arranged above the winding portions L11 in the thickness direction z. In this case, the first coil L1 is not exposed from the third element obverse surface 30*a* and covered by the upper covering portion 312.

As shown in FIG. 10, the lower wiring layer 33 is formed below the intermediate portion 311 in the thickness direction z. The lower wiring layer 33 includes the second coil L2 and a plurality of lead wires 331.

As shown in FIGS. 10 and 12, the second coil L2 is provided on the third element reverse surface 30*b*. The second coil L2 is arranged between the first coil L1 and the support substrate 4 (a base member 41 described below) in the thickness direction z. As shown in FIGS. 10 and 12, the second coil L2 includes a plurality of winding portions L21. In the illustrated example, the number of winding portions L21 is the same as the number of winding portions L11, namely, four. The number of winding portions L21 is not limited to four, and may be changed appropriately according to the specifications of the semiconductor device A1. Each of the winding portions L21 is wound along a plane (x-y plane) perpendicular to the thickness direction z. Each of the winding portions L21 is wound in a spiral. Each of the winding portions L21 is wound in an ellipse in plan view. Alternatively, each of the winding portions L21 may be wound in a circle or a rectangle. As shown in FIGS. 2, 7 and 10, the winding portions L21 overlap with the winding portions L11 in plan view. The winding portions L21 are magnetically coupled to the respective winding portions L11. As a result, the first coil L1 and the second coil L2 are magnetically coupled to each other.

As shown in FIG. 7 and FIGS. 10 to 12, each of the winding portions L21 has an inner end L22 and an outer end L23. The inner end L22 is the end of the winding portion L21 located inside, and the outer end L23 is the end of the winding portion L21 located outside. In plan view, the inner end L22 is located at the center of the winding portion L21. In the illustrated example, the inner end L22 overlaps with the winding axis of the winding portion L21 in plan view. Each winding portion L21, starting from the inner end L22, extends along a predetermined trajectory for the winding portion L21 and reaches the outer end L23. One of the inner end L22 and the outer end L23 is a current input end of the winding portion L21, and the other is a current output end of the winding portion L21.

The lead wires 331 electrically connect the winding portions L21 to each other in the lower wiring layer 33, and electrically connect the winding portions L21 to the fourth pads 35. As shown in FIG. 7 and FIGS. 10 to 12, the lead wires 331 include: one that is connected to the outer ends L23 of the two winding portions L21 arranged in one sense of the second direction y, and that is connected to one of the fourth pads 35; one that is connected to the outer ends L23 of the two winding portions L21 arranged in the other sense of the second direction y, and that is connected to one of the fourth pads 35; and those that are connected to the inner ends L22 of the winding portions L21 and the fourth pads 35. As shown in FIG. 12, some of the lead wires 331 are located above the second coil L2 (the winding portions L21) in the thickness direction z and between the second coil L2 (the winding portions L21) and the intermediate portion 311. Unlike this configuration, however, they may be arranged below the winding portions L21 in the thickness direction z. In this case, the second coil L2 is not exposed from the third element reverse surface 30*b* and covered by the lower covering portion 313.

As shown in FIG. 7 and FIGS. 10 to 12, the third pads 34 are provided on the third element reverse surface 30*b*. The constituent material of the third pads 34 is Cu or a Cu alloy, for example. The constituent material may not be either Cu or a Cu alloy, but may be Al or an Al alloy. The third pads 34 are electrically connected to the upper wiring layer 32 via the connecting wires 36. As shown in FIG. 2, the third pads 34 are arranged closer to the first semiconductor element 1 than the first coil L1 and the second coil L2 in the first direction x.

As shown in FIG. 7 and FIGS. 10 to 12, the fourth pads 35 are provided on the third element reverse surface 30*b*. The constituent material of the fourth pads 35 is Cu or a Cu alloy, for example. The constituent material may not be either Cu or a Cu alloy, but may be Al or an Al alloy. Each of the fourth pads 35 is electrically connected to the lower wiring layer 33. As shown in FIG. 2, the fourth pads 35 are arranged closer to the second semiconductor element 2 than the first coil L1 and the second coil L2 in the first direction x.

The connecting wires 36 connect the lead wires 321 of the upper wiring layer 32 and the third pads 34. The connecting wires 36 are covered with the third insulating layer 31. The connecting wires 36 extend in the thickness direction z and penetrate through the intermediate portion 311 and the lower covering portion 313.

As shown in FIG. 10, in the insulating element 3, the third insulating layer 31 (lower covering portion 313), the third pads 34, and the fourth pads 35 are exposed from the third element reverse surface 30*b*. Since the third element reverse surface 30*b* in the semiconductor device A1 faces downward in the thickness direction z, the third insulating layer 31, the third pads 34, and the fourth pads 35 are exposed from the lower surface (the surface facing downward in the thickness direction z) of the insulating element 3. The surface of the third insulating layer 31 located downward in the thickness direction z, the surfaces of the third pads 34 located downward in the thickness direction z, and the surfaces of the fourth pads 35 located downward in the thickness direction z are flush with each other. For example, these surfaces will be flush with each other by mirror-finishing the third element reverse surface 30*b*. In the example shown in FIG. 10, a portion (e.g., first coil L1) of the upper wiring layer 32 is exposed from the third element obverse surface 30*a*, and a portion (e.g., second coil L2) of the lower wiring layer 33 is exposed from the third element reverse surface 30*b*. The surface of a portion (e.g., second coil L2) of the lower wiring layer 33 located downward in the thickness direction z is flush with the surface of the third insulating layer 31 located downward in the thickness direction z.

The support substrate 4 has the first semiconductor element 1, the second semiconductor element 2, and the insulating element 3 mounted thereon, and supports these elements. A portion (substrate wiring 42 described below) of the support substrate 4 forms a conductive path between the first semiconductor element 1, the second semiconductor element 2, the insulating element 3, the first external terminals 51, and the second external terminals 52.

As shown in FIGS. 4 to 11, the support substrate 4 has a mounting surface 40*a* and a terminal surface 40*b*. The mounting surface 40*a* and the terminal surface 40*b* are spaced apart from each other in the thickness direction z. The mounting surface 40*a* faces upward in the thickness direction z, and the terminal surface 40*b* faces downward in the thickness direction z. The mounting surface 40*a* and the terminal surface 40*b* are flat. The mounting surface 40*a* is mirror-finished, for example. As shown in FIGS. 4 to 11, the first semiconductor element 1, the second semiconductor element 2, and the insulating element 3 are mounted on the mounting surface 40*a*. The first semiconductor element 1 (first element obverse surface 10*a*), the second semiconductor element 2 (second element obverse surface 20*a*), and the insulating element 3 (third element obverse surface 30*a*) are in close contact with and directly joined to the mounting surface 40*a*. In the present disclosure, "A and B are in close contact" means that A and B are in close contact with each other. Under ideal conditions, there are no intervening inclusions (e.g., foreign matter such as dirt and dust) or voids at the boundary between A and B, but there may be a case where some inclusions or voids exist at the boundary. Furthermore, "A and B are directly joined" means that A and B are joined to each other without an adhesive or the like therebetween. Under ideal conditions, when A and B are directly joined, A and B come into close contact with each other. As shown in FIGS. 4 to 7 and FIG. 11, the first external terminals 51 and the second external terminals 52 are arranged on the terminal surface 40*b*.

As shown in FIGS. 1 to 11, the support substrate 4 includes a base member 41, substrate wiring 42, and a plurality of through wires 43.

The base member 41 is made of an insulating material. The insulating material is amorphous glass such as $SiO_2$. The insulating material may be ceramics such as AlN, instead of $SiO_2$. As shown in FIGS. 1 to 3, the base member 41 has a rectangular shape in plan view, for example. The base member 41 has a trench area formed by trenching. The trench area is formed in a portion of the upper surface (the surface facing upward in the thickness direction z) of the base member 41, and is recessed from the upper surface of the base member 41 (in the thickness direction z). The substrate wiring 42 is formed in the trench area.

The substrate wiring 42 is formed on the upper surface (the surface facing upward in the thickness direction z) of the base member 41. The constituent material of the substrate wiring 42 is Cu or a Cu alloy, for example.

As shown in FIGS. 2, 3, 7 to 11, the substrate wiring 42 includes a plurality of first wiring members 421 and a plurality of second wiring members 422.

Each of the first wiring members 421 is electrically interposed between the first semiconductor element 1 and the first coil L1 of the insulating element 3. Each of the electrodes 141 of the first semiconductor element 1 and each of the third pads 34 of the insulating element 3 are directly joined to a different one of the first wiring members 421. Each of the first wiring members 421 extends from the area overlapping with the first semiconductor element 1 to the area overlapping with the insulating element 3 in plan view. In the example shown in FIGS. 2 and 3, each of the first wiring members 421 has a strip shape extending in the first direction x in plan view, and is arranged in parallel to (or in substantially parallel to) the second direction y in plan view. The shape and arrangement of each first wiring portion 421 are not limited to the example shown in FIGS. 2 and 3, and can be modified appropriately according to the position of each electrode 141 of the first semiconductor element 1 and the position of each third pad 34 of the insulating element 3. Each of the first wiring members 421 is a portion of the first circuit described above.

Each of the second wiring members 422 is electrically interposed between the second semiconductor element 2 and the second coil L2 of the insulating element 3. Each of the electrodes 241 of the second semiconductor element 2 and each of the fourth pads 35 of the insulating element 3 are directly joined to a different one of the second wiring members 422. Each of the second wiring members 422 extends from the area overlapping with the second semiconductor element 2 to the area overlapping with the insulating element 3 in plan view. In the example shown in FIGS. 2 and 3, each of the second wiring members 422 has a strip shape extending in the first direction x in plan view, and is arranged in parallel to (or in substantially parallel to) the second direction y in plan view. The shape and arrangement of each second wiring portion 422 are not limited to the example shown in FIGS. 2 and 3, and can be modified appropriately according to the position of each electrode 241 of the second semiconductor element 2 and the position of each fourth pad 35 of the insulating element 3. Each of the second wiring members 422 is a portion of the second circuit described above.

In the support substrate 4, portions of the base member 41 and the substrate wiring 42 (the first wiring members 421 and the second wiring members 422) are exposed from the mounting surface 40*a*. The surface of the base member 41 located upward in the thickness direction z is flush with the surface of the substrate wiring 42 located upward in the thickness direction z. For example, these surfaces will be flush with each other by mirror-finishing the mounting surface 40*a*. The mounting surface 40*a* is constituted of the surface of the base member 41 located upward in the thickness direction z and the surface of the substrate wiring 42 located upward in the thickness direction z.

In the semiconductor device A1, the first semiconductor element 1 and the support substrate 4 are such that some (the electrodes 141) of the first pads 14 are directly joined to the first wiring members 421, and that the first insulating layer 13 is directly joined to the base member 41. As a result, the first semiconductor element 1 is in close contact with the support substrate 4. The second semiconductor element 2 and the support substrate 4 are such that some (the electrodes 241) of the second pads 24 are directly joined to the second wiring members 422, and that the second insulating layer 23 is directly joined to the base member 41. As a result, the second semiconductor element 2 is in close contact with the support substrate 4. The insulating element 3 and the support substrate 4 are such that the third pads 34 are directly joined to the first wiring members 421, that the fourth pads 35 are directly joined to the second wiring members 422, and that the third insulating layer 31 is directly joined to base member 41. As a result, the insulating element 3 is in close contact with the support substrate 4.

The through wires 43 penetrate through the base member 41 in the thickness direction z. The constituent material of the through wires 43 is Cu or a Cu alloy, for example. The through wires 43 include a plurality of first penetrating members 431 and a plurality of second penetrating members 432.

Each of the first penetrating members 431 is in contact with one of the electrodes 142 of the first semiconductor element 1 and one of the first external terminals 51 to electrically connect them. Each of the electrodes 142 is directly joined to the upper surface (the surface facing upward in the thickness direction z) of one of the first penetrating members 431. As shown in FIG. 3, the first penetrating members 431 in the semiconductor device A1 overlap with the first semiconductor element 1 in plan view. Each of the first penetrating members 431 is a portion of the first circuit described above.

Each of the second penetrating members 432 is in contact with one of the electrodes 242 of the second semiconductor element 2 and one of the second external terminals 52 to electrically connect them. Each of the electrodes 242 is directly joined to the upper surface (the surface facing upward in the thickness direction z) of one of the second penetrating members 432. As shown in FIG. 3, the second penetrating members 432 in the semiconductor device A1 overlap with the second semiconductor element 2 in plan view. Each of the second penetrating members 432 is a portion of the second circuit.

In the semiconductor device A1, the through wires 43 may be formed by the following method. The base member 41 is irradiated with a laser beam, whereby through-holes (or grooves) are formed in the base member 41 in the thickness direction z. Then, Cu or a Cu alloy is provided in each of the through-holes (or grooves) in the base member 41 to form the through wires 43. In the case where the grooves are formed in the base member 41, the through wires 43 are formed by placing Cu or a Cu alloy in the grooves in the base member 41 and then grinding the surface of the base member 41 located opposite to the grooved surface.

The first external terminals 51 are electrically connected to the first semiconductor element 1. The first external terminals 51 are terminals used when the semiconductor device A1 is mounted on a circuit board. As shown in FIGS. 4, 6, 7 and 11, the first external terminals 51 are formed on the terminal surface 40*b* of the support substrate 4. As shown in FIG. 3, the first external terminals 51 overlap with the respective first penetrating members 431 in plan view, and overlap with the first semiconductor element 1 in plan view. As shown in FIGS. 7 and 11, the first external terminals 51 are in contact with the lower surfaces (the surfaces facing downward in the thickness direction z) of the respective first penetrating members 431. The first external terminals 51 are electrically connected to the respective electrodes 142 via the first penetrating members 431. In the example shown in FIGS. 2 and 3, the first external terminals 51 are arranged in the second direction y in correspondence with the positions of the electrodes 142. The arrangement of the first external terminals 51 is not limited to the illustrated example, and can be changed appropriately according to the positions of the electrodes 142. The first external terminals 51 are formed by electroless plating, for example. Each of the first external terminals 51 is constituted of a nickel (Ni) layer in contact with the corresponding first penetrating member 431, a palladium (Pd) layer covering the Ni layer, and a gold (Au) layer covering the Pd layer, for example. Each of the first external terminals 51 is not limited to the above configuration, and may be constituted of a Ni layer and a Au layer stacked on each other or may be constituted of only a Au layer. Alternatively, it may be constituted of ball-shaped solder.

The second external terminals 52 are electrically connected to the second semiconductor element 2. The second external terminals 52 are terminals used when the semiconductor device A1 is mounted on a circuit board. As shown in FIGS. 4, 5, 7 and 11, the second external terminals 52 are formed on the terminal surface 40*b* of the support substrate 4. As shown in FIG. 3, the second external terminals 52 overlap with the respective second penetrating members 432 in plan view. As shown in FIGS. 7 and 11, the second external terminals 52 are in contact with the lower surfaces (the surfaces facing downward in the thickness direction z) of the respective second penetrating members 432. The second external terminals 52 are electrically connected to the respective electrodes 242 via the second penetrating members 432. In the example shown in FIGS. 2 and 3, the second external terminals 52 are arranged in the second direction y in correspondence with the positions of the electrodes 242. The arrangement of the second external terminals 52 is not limited to the illustrated example, and can be changed appropriately according to the positions of the electrodes 242. The second external terminals 52 are formed by electroless plating, for example. Each of the second external terminals 52 is constituted of a Ni layer in contact with the corresponding second penetrating member 432, a Pd layer covering the Ni layer, and a Au layer covering the Pd layer, for example. Each of the second external terminals 52 is not limited to the above configuration, and may be constituted of a Ni layer and a Au layer stacked on each other or may be constituted of only a Au layer. Alternatively, it may be constituted of ball-shaped solder.

The sealing resin 6 is formed over the support substrate 4 (on the mounting surface 40*a*), and covers the first semiconductor element 1, the second semiconductor element 2, and the insulating element 3. The sealing resin 6 is in contact with the mounting surface 40*a* of the support substrate 4. As shown in FIG. 1, the sealing resin 6 has a rectangular shape in plan view, for example.

The sealing resin 6 has a top surface 61, a pair of first side surfaces 63, and a pair of second side surfaces 64. As shown in FIGS. 4 to 11, the top surface 61 faces upward in the thickness direction z. The top surface 61 is flat (or substantially flat). The pair of first side surfaces 63 are connected to the top surface 61. The pair of first side surfaces 63 are flat (or substantially flat). As shown in FIG. 1, the pair of first side surfaces 63 are spaced apart from each other in the first direction x, and face away from each other in the first direction x. In the example shown in FIGS. 4, 7, and 11, the pair of first side surfaces 63 are perpendicular to the top surface 61. The pair of second side surfaces 64 are connected to the top surface 61. The pair of second side surfaces 64 are flat (or substantially flat). As shown in FIG. 1, the pair of second side surfaces 64 are spaced apart from each other in the second direction y, and face away from each other in the second direction y. In the example shown in FIGS. 5 and 6, the pair of second side surfaces 64 are perpendicular to the top surface 61.

The following describes the operation and advantages of the semiconductor device A1.

The semiconductor device A1 includes the support substrate 4 on which the first semiconductor element 1 and the second semiconductor element 2 are mounted. The support substrate 4 includes the insulating base member 41, and the substrate wiring 42 formed on the base member 41. The substrate wiring 42 includes the first wiring members 421 and the second wiring members 422. The first wiring members 421 are electrically interposed between the first semiconductor element 1 and the first coil L1. The second wiring members 422 are electrically interposed between the second semiconductor element 2 and the second coil L2. According to the configuration, the first circuit (e.g., first wiring members 421) including the first semiconductor element 1 and the second circuit (e.g., second wiring members 422) including the second semiconductor element 2 are insulated from each other by the base member 41. As such, the dielectric strength of the base member 41 affects the dielectric strength between the first circuit and the second circuit, namely the dielectric strength of the semiconductor device A1, and the dielectric strength of the semiconductor device A1 does not rely on the separation distance between the first island and the second island as can be seen in the conventional semiconductor device (Patent document 1). Accordingly, the semiconductor device A1 can suppress a decrease in the dielectric strength even when the semiconductor device A1 is downsized.

In the semiconductor device A1, the first pads 14 are exposed from the first element obverse surface 10*a*, and the first element obverse surface 10*a* faces the mounting surface 40*a*. The electrodes 141 of the first pads 14 are joined to the first wiring members 421. In this configuration, the first semiconductor element 1 is flip-chip bonded to the support substrate 4, and there is no need for providing a bonding wire. Accordingly, the semiconductor device A1 is preferable for downsizing (particularly downsizing the dimension in the thickness direction z).

In the semiconductor device A1, the first semiconductor element 1 and the support substrate 4 are such that the electrodes 141 of the first pads 14 are directly joined to the first wiring members 421 of the substrate wiring 42, and that the first insulating layer 13 is directly joined to the base member 41. In the semiconductor device A1, the first semiconductor element 1 and the support substrate 4 are in close contact with each other by, for example, mirror-finishing the first element obverse surface 10*a* and the mounting surface 40*a*. According to the configuration of the semiconductor device A1, the first semiconductor element 1 can be joined to the support substrate 4 without using an adhesive. Furthermore, in the semiconductor device A1, the first semiconductor element 1 and the support substrate 4 are in close contact with each other, thus reducing a gap between the first semiconductor element 1 and the support substrate 4. Unlike the semiconductor device A1, if the first semiconductor element 1 is joined to the support substrate 4 by a conductive bonding member or the like, a gap corresponding to the thickness of the conductive bonding member may be formed between the first semiconductor element 1 and the support substrate 4. There is a case where foreign matter, such as dirt or dust, and the sealing resin 6 may enter the gap. Formation of a gap, entrance of foreign matter, and intervention of the sealing resin 6 are the causes of a decrease in the dielectric strength and a decrease in the bonding strength between the first semiconductor element 1 and the support substrate 4. On the other hand, the semiconductor device A1 is configured such that the first semiconductor element 1 and the support substrate 4 are in close contact with each other. This makes it possible to suppress formation of a gap, entrance of foreign matter, and intervention of the sealing resin 6. In other words, the semiconductor device A1 can suppress a decrease in the dielectric strength and a decrease in the bonding strength between the first semiconductor element 1 and the support substrate 4.

In the semiconductor device A1, each of the first insulating layer 13 and the base member 41 is made of glass (e.g., $SiO_2$). In other words, the first insulating layer 13 and the base member 41 are made of the same material. This configuration can enhance the adherence between the first insulating layer 13 and the base member 41 as compared to the configuration where the first insulating layer 13 and the base member 41 are made of different materials. Accordingly, the semiconductor device A1 can suppress peeling of the first semiconductor element 1 from the support substrate 4. This also applies to the relationship between some (the electrodes 141) of the first pads 14 and the first wiring members 421.

In the semiconductor device A1, the second pads 24 are exposed from the second element obverse surface 20*a*, and the second element obverse surface 20*a* faces the mounting surface 40*a*. The electrodes 241 of the second pads 24 are joined to the second wiring members 422. In this configuration, the second semiconductor element 2 is flip-chip bonded to the support substrate 4, and there is no need for providing a bonding wire. Accordingly, the semiconductor device A1 is preferable for downsizing (particularly downsizing the dimension in the thickness direction z).

In the semiconductor device A1, the second semiconductor element 2 and the support substrate 4 are such that the electrodes 241 of the second pads 24 are directly joined to the second wiring members 422 of the substrate wiring 42, and that the second insulating layer 23 is directly joined to the base member 41. In the semiconductor device A1, the second semiconductor element 2 and the support substrate 4 are in close contact with each other by, for example, mirror-finishing the second element obverse surface 20*a* and the mounting surface 40*a*. According to the configuration of the semiconductor device A1, the second semiconductor element 2 can be joined to the support substrate 4 without using an adhesive. Furthermore, in the semiconductor device A1, the second semiconductor element 2 and the support substrate 4 are in close contact with each other, thus reducing a gap between the second semiconductor element 2 and the support substrate 4. As such, the semiconductor device A1 can suppress formation of a gap, entrance of foreign matter, and intervention of the sealing resin 6 between the second semiconductor element 2 and the support substrate 4, thereby suppressing a decrease in the dielectric strength and a decrease in the bonding strength between the second semiconductor element 2 and the support substrate 4.

In the semiconductor device A1, each of the second insulating layer 23 and the base member 41 is made of glass (e.g., $SiO_2$). In other words, the second insulating layer 23 and the base member 41 are made of the same material. This configuration can enhance the adherence between the second insulating layer 23 and the base member 41 as compared to the configuration where the second insulating layer 23 and the base member 41 are made of different materials. Accordingly, the semiconductor device A1 can suppress peeling of the second semiconductor element 2 from the support substrate 4. This also applies to the relationship between some (the electrodes 241) of the second pads 24 and the second wiring members 422.

In the semiconductor device A1, the third pads 34 and the fourth pads 35 are exposed from the third element reverse surface 30*b*, and the third element reverse surface 30*b* is located on the opposite side from the terminal surface 40*b*. The third pads 34 are joined to the first wiring members 421, and the fourth pads 35 are joined to the second wiring members 422. According to this configuration, there is no need for using bonding wires to electrically connect the third pads 34 and the first wiring members 421 and to electrically connect the fourth pads 35 and the second wiring members 422. Accordingly, the semiconductor device A1 is preferable for downsizing (particularly downsizing the dimension in the thickness direction z).

In the semiconductor device A1, the insulating element 3 and the support substrate 4 are such that the third pads 34 are directly joined to the first wiring members 421, that the fourth pads 35 are directly joined to the second wiring members 422, and that the third insulating layer 31 is directly joined to base member 41. In the semiconductor device A1, the insulating element 3 and the support substrate 4 are in close contact with each other by, for example, mirror-finishing the third element reverse surface 30*b* and the mounting surface 40*a*. According to this configuration, the insulating element 3 can be joined to the support substrate 4 without using an adhesive. Furthermore, in the semiconductor device A1, the insulating element 3 and the support substrate 4 are in close contact with each other, thus reducing a gap between the insulating element 3 and the support substrate 4. As such, the semiconductor device A1 can suppress formation of a gap, entrance of foreign matter, and intervention of the sealing resin 6 between the insulating element 3 and the support substrate 4, thereby suppressing a decrease in the dielectric strength and a decrease in the bonding strength between the insulating element 3 and the support substrate 4.

In the semiconductor device A1, each of the third insulating layer 31 and the base member 41 is made of glass (e.g., $SiO_2$). In other words, the third insulating layer 31 and the base member 41 are made of the same material. This configuration can enhance the adherence between the third insulating layer 31 and the base member 41 as compared to the configuration where the third insulating layer 31 and the base member 41 are made of different materials. Accordingly, the semiconductor device A1 can suppress peeling of the insulating element 3 from the support substrate 4. This also applies to the relationship between the third pads 34 and the first wiring members 421 and the relationship between the fourth pads 35 and the second wiring members 422.

In the semiconductor device A1, the first coil L1 and the second coil L2 are located between the first semiconductor element 1 and the second semiconductor element 2 in plan view. In other words, the first semiconductor element 1 and the second semiconductor element 2 are located opposite from each other with the insulating element 3 therebetween in plan view. This configuration can ensure an appropriate separation distance between the first wiring members 421 and the second wiring members 422. In other words, the above configuration can ensure the separation distance between the first circuit including the first semiconductor element 1 and the second circuit including the second semiconductor element 2. Thus, the semiconductor device A1 is preferable for improving the dielectric strength.

Figure 13:
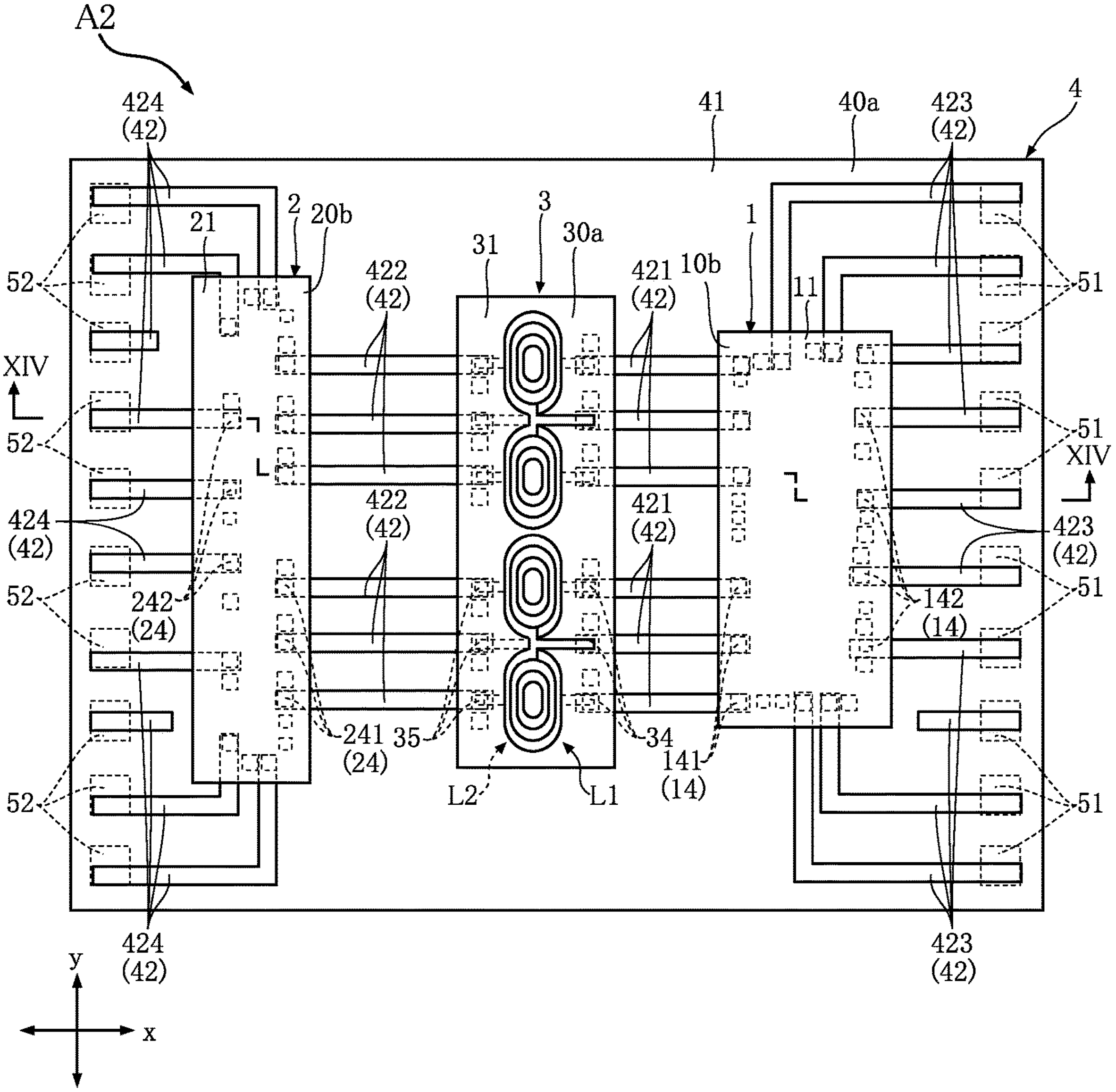
FIG. 13 is a plan view showing a semiconductor device according to a second embodiment, from which the sealing resin is omitted.
Figure 14:
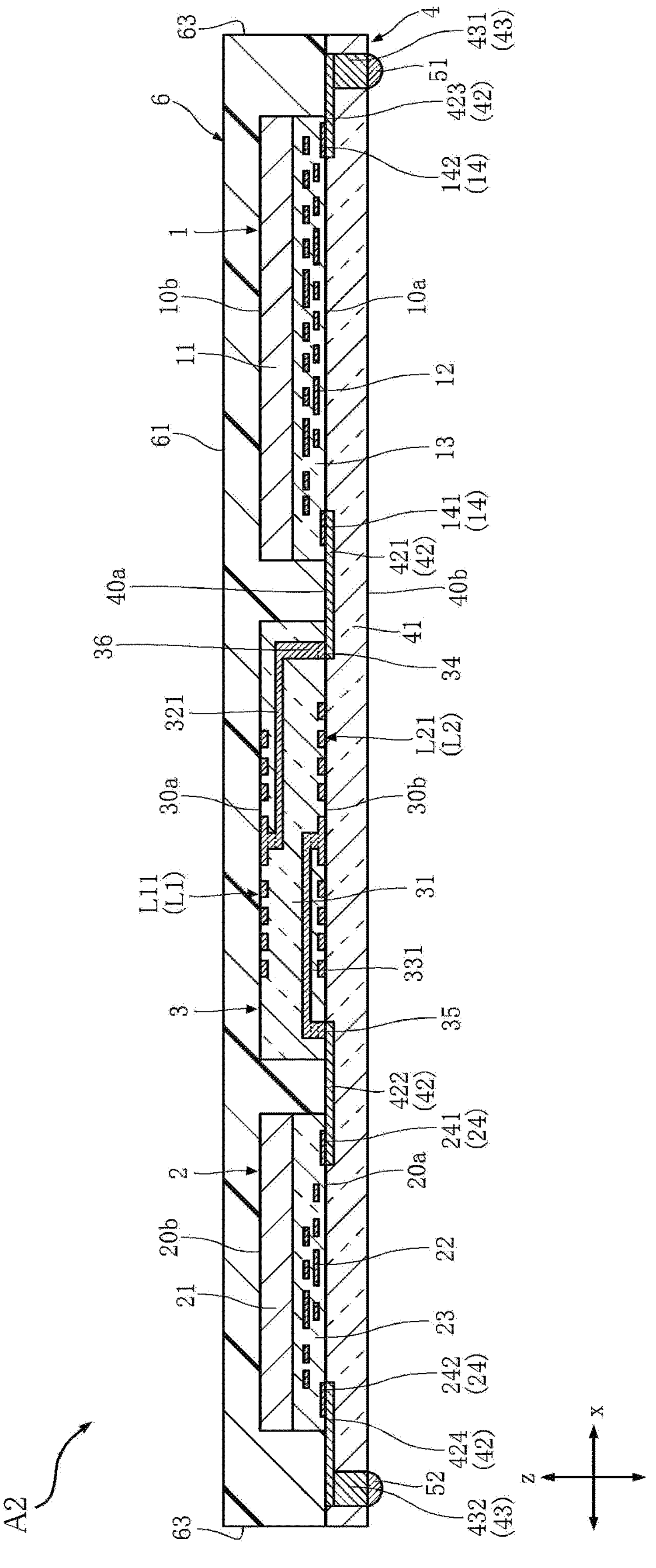
FIG. 14 is a cross-sectional view taken along line XIV-XIV in FIG. 13.

FIGS. 13 and 14 show a semiconductor device A2 according to a second embodiment. As shown in these figures, the semiconductor device A2 is different from the semiconductor device A1 mainly in the following points. Firstly, the substrate wiring 42 in the semiconductor device A2 further includes a plurality of third wiring members 423 and a plurality of fourth wiring members 424. Secondly, the first external terminals 51 in the semiconductor device A2 are located outside the first semiconductor element 1 in plan view. Thirdly, the second external terminals 52 in the semiconductor device A2 are located outside the second semiconductor element 2 in plan view.

Each of the third wiring members 423 is electrically interposed between the first semiconductor element 1 and one of the first external terminals 51. Each of the electrodes 142 of the first semiconductor element 1 is directly joined to one of the third wiring members 423. Each of the third wiring members 423 extends from the area overlapping with the first semiconductor element 1 to the area overlapping with one of the first external terminals 51 in plan view. As described above, the first external terminals 51 are located outside the first semiconductor element 1 in plan view. The shape and arrangement of each third wiring member 423 are not limited to the example shown in FIG. 13, and can be modified appropriately according to the position of each electrode 142 of the first semiconductor element 1 and the position of each first external terminal 51.

Each of the fourth wiring members 424 is electrically interposed between the second semiconductor element 2 and one of the second external terminals 52. Each of the electrodes 242 of the second semiconductor element 2 is directly joined to one of the fourth wiring members 424. Each of the fourth wiring members 424 extends from the area overlapping with the second semiconductor element 2 to the area overlapping with one of the second external terminals 52 in plan view. As described above, the second external terminals 52 are located outside the second semiconductor element 2 in plan view. The shape and arrangement of each fourth wiring member 424 are not limited to the example shown in FIG. 13, and can be modified appropriately according to the position of each electrode 242 of the second semiconductor element 2 and the position of each second external terminal 52.

Similarly to the semiconductor device A1, the semiconductor device A2 is configured such that the first circuit including the first semiconductor element 1 and the second circuit including the second semiconductor element 2 are insulated from each other by the base member 41. In other words, similarly to the semiconductor device A1, the semiconductor device A2 can also suppress a decrease in the dielectric strength even when the semiconductor device A2 is downsized. Furthermore, the semiconductor device A2 has advantages similar to the semiconductor device A1 owing to its common configuration with the semiconductor device A1.

In the semiconductor device A2, the substrate wiring 42 includes the third wiring members 423, and each of the third wiring members 423 is provided between the first semiconductor element 1 and one of the first external terminals 51. According to the configuration, the third wiring members 423 extend beyond the first semiconductor element 1 in plan view, so that the first external terminals 51 can be arranged outside the first semiconductor element 1 in plan view. In other words, the semiconductor device A2 has a higher degree of freedom in the arrangement of the first external terminals 51. Similarly, the substrate wiring 42 in the semiconductor device A2 includes the fourth wiring members 424. Each of the fourth wiring members 424 is interposed between the second semiconductor element 2 and one of the second external terminals 52. According to the configuration, the fourth wiring members 424 extend beyond the first semiconductor element 1 in plan view, so that the second external terminals 52 can be arranged outside the first semiconductor element 1 in plan view. In other words, the semiconductor device A2 has a higher degree of freedom in the arrangement of the second external terminals 52.

Figure 15:
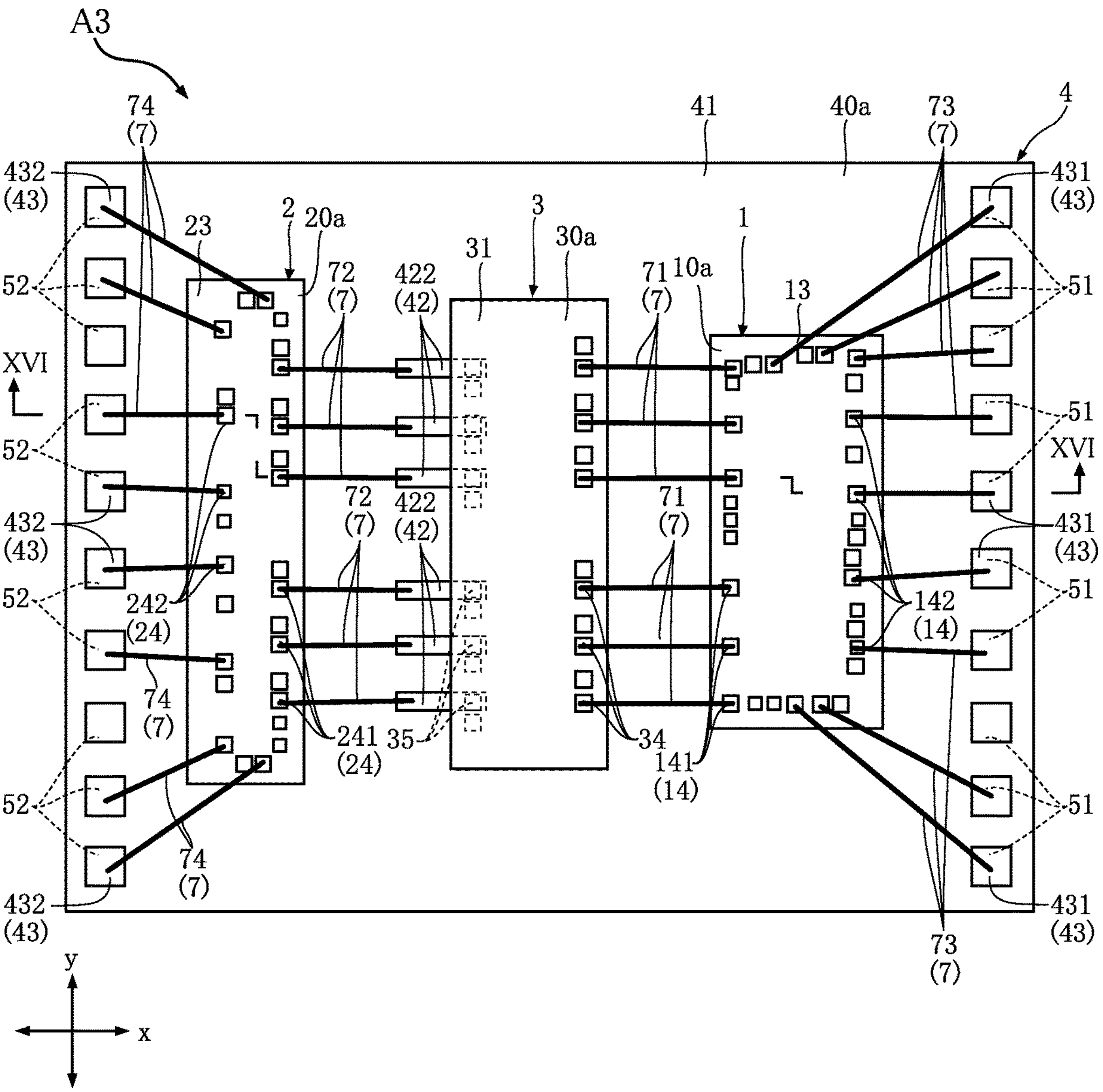
FIG. 15 is a plan view showing a semiconductor device according to a third embodiment, from which the sealing resin is omitted.
Figure 16:
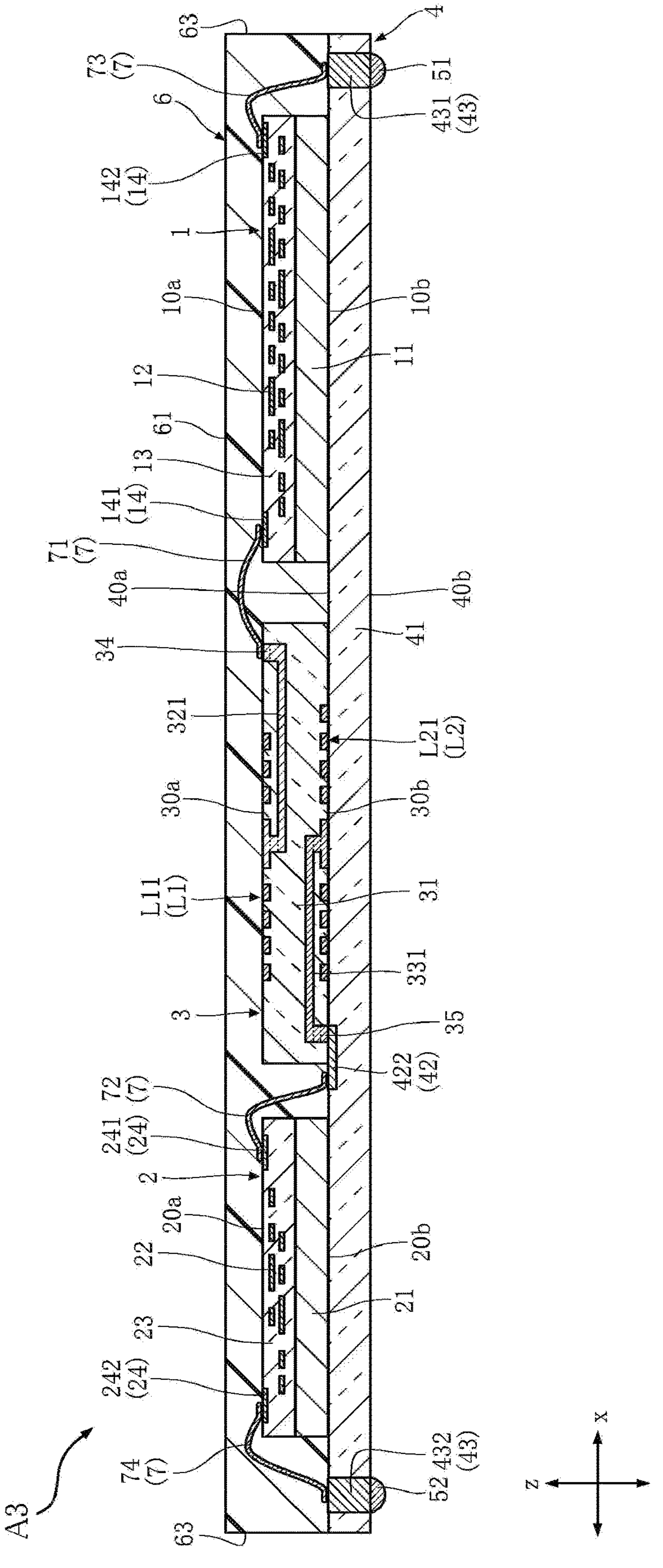
FIG. 16 is a cross-sectional view taken along line XVI-XVI in FIG. 15.

FIGS. 15 and 16 show a semiconductor device A3 according to a third embodiment. As shown in these figures, the semiconductor device A3 is different from the semiconductor device A1 mainly in the following points. Firstly, in the semiconductor device A3, the orientation of the first semiconductor element 1 in the thickness direction z is reversed. Secondly, in the semiconductor device A3, the orientation of the second semiconductor element 2 in the thickness direction z is reversed. Thirdly, the semiconductor device A3 further includes a plurality of connecting members 7.

In the semiconductor device A3, the first semiconductor element 1 is arranged such that the first element reverse surface 10*b* faces the support substrate 4. As a result, the first pads 14 (the electrodes 141 and 142) are exposed from the upper surface (the surface facing upward in the thickness direction z) of the first semiconductor element 1.

Similarly, in the semiconductor device A3, the second semiconductor element 2 is arranged such that the second element reverse surface 20*b* faces the support substrate 4. As a result, the second pads 24 (the electrodes 241 and 242) are exposed from the upper surface of the second semiconductor element 2.

In the semiconductor device A3, the third pads 34 of the insulating element 3 are exposed from the third element obverse surface 30*a*. Accordingly, the insulating element 3 does not include the connecting wires 36.

The semiconductor device A3 is similar to the semiconductor device A2 in that the first external terminals 51 and the first penetrating members 431 (some of the through wires 43) are arranged outside the first semiconductor element 1 in plan view. Furthermore, similarly to the semiconductor device A2, the second external terminals 52 and the second penetrating members 432 (some of the through wires 43) are arranged outside the second semiconductor element 2 in plan view.

Each of the connecting members 7 electrically connect two elements that are spaced apart from each other. The connecting members 7 are bonding wires, for example. The constituent material of each connecting member 7 includes Au, Cu, or Al. The connecting members 7 include a plurality of first wires 71, a plurality of second wires 72, a plurality of third wires 73, and a plurality of fourth wires 74.

Each of the first wires 71 is joined to one of the electrodes 141 (some of the first pads 14) of the first semiconductor element 1 and one of the third pads 34 of the insulating element 3, and electrically connects them. In the semiconductor device A3, the electrodes 141 and the third pads 34 are electrically connected to each other by the first wires 71, and the substrate wiring 42 therefore does not include the first wiring members 421, as shown in FIGS. 15 and 16.

Each of the second wires 72 is joined to one of the electrodes 241 (some of the second pads 24) of the second semiconductor element 2 and one of the second wiring members 422 of the substrate wiring 42, and electrically connects them. Similarly to the semiconductor device A1, each of the second wiring members 422 in the semiconductor device A3 is joined to one of the fourth pads 35. However, the second wiring members 422 do not extend to the second semiconductor element 2 in plan view, and are not joined to the electrodes 241. In the semiconductor device A3, the electrodes 241 and the second wiring members 422 are electrically connected to each other by the second wires 72. Accordingly, the second wiring members 422 do not overlap with the second semiconductor element 2 in plan view, as shown in FIGS. 15 and 16.

Each of the third wires 73 is joined to one of the electrodes 142 (some of the first pads 14) of the first semiconductor element 1 and one of the first penetrating members 431 of the through wires 43, and electrically connects them. In the semiconductor device A3, the electrodes 142 and the first penetrating members 431 are electrically connected to each other by the third wires 73, and the substrate wiring 42 therefore does not include the third wiring members 423, as shown in FIGS. 15 and 16.

Each of the fourth wires 74 is joined to one of the electrodes 242 (some of the second pads 24) of the second semiconductor element 2 and one of the second penetrating members 432 of the through wires 43, and electrically connects them. In the semiconductor device A3, the electrodes 242 and the second penetrating members 432 are electrically connected to each other by the fourth wires 74, and the substrate wiring 42 therefore does not include the fourth wiring members 424, as shown in FIGS. 15 and 16.

Similarly to the semiconductor devices A1 and A2, the semiconductor device A3 is configured such that the first circuit including the first semiconductor element 1 and the second circuit including the second semiconductor element 2 are insulated from each other by the base member 41. In other words, similarly to the semiconductor devices A1 and A2, the semiconductor device A3 can also suppress a decrease in the dielectric strength even when the semiconductor device A3 is downsized. Furthermore, the semiconductor device A3 has advantages similar to each of the semiconductor devices A1 and A2 owing to its common configuration with each of the semiconductor devices A1 and A2.

Figure 17:
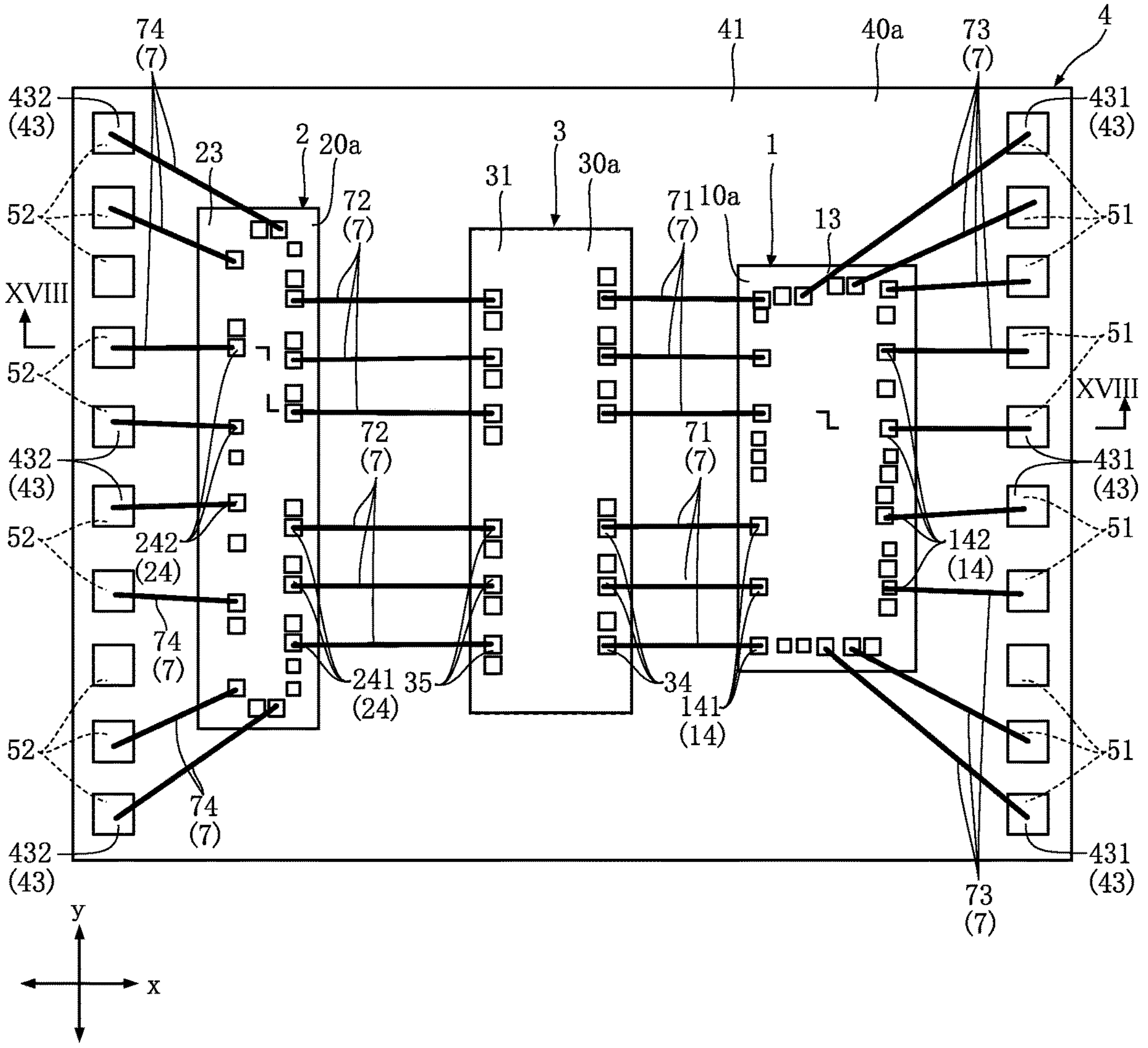
FIG. 17 is a plan view showing a semiconductor device according to a variation of the third embodiment, from which the sealing resin is omitted.
Figure 18:
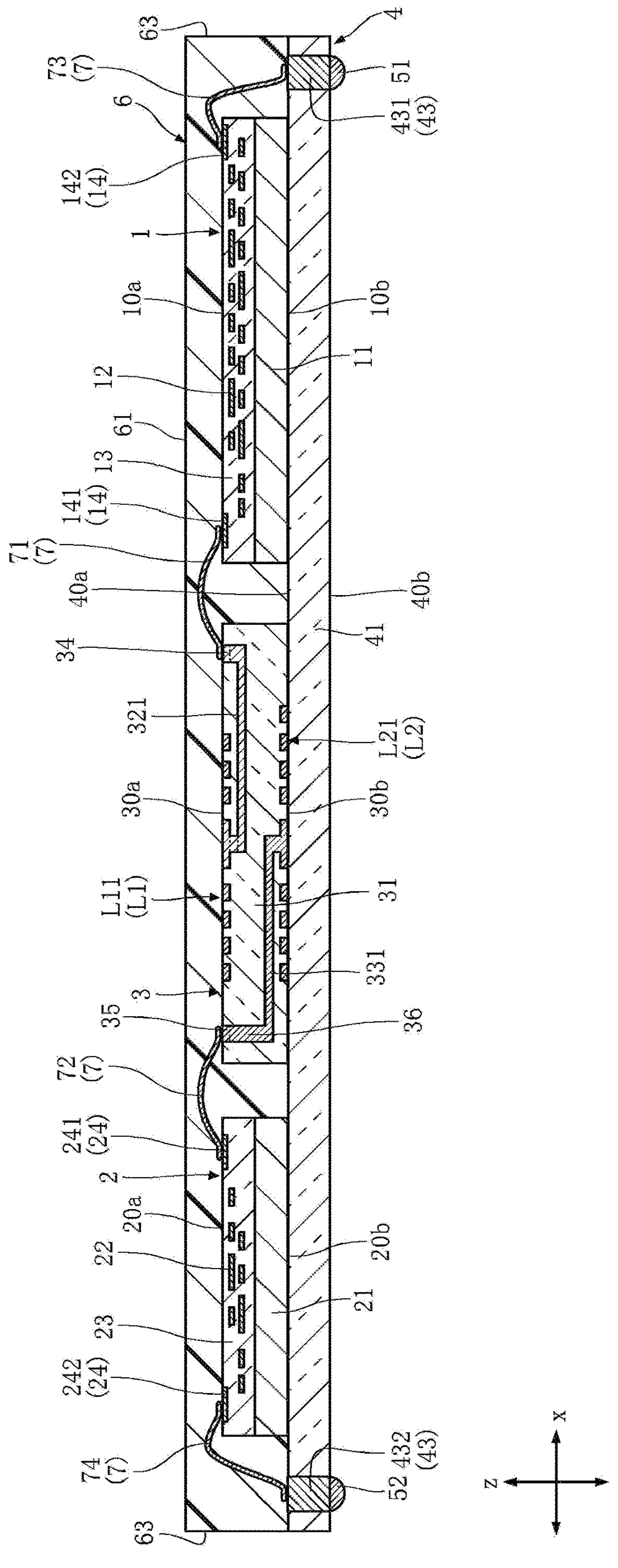
FIG. 18 is a cross-sectional view taken along line XVIII-XVIII in FIG. 17.

Since the fourth pads 35 are arranged on the third element reverse surface 30*b* in the semiconductor device A3, the substrate wiring 42 includes the second wiring members 422 to electrically connect the second wires 72 and the fourth pads 35. Unlike this configuration, when the fourth pads 35 are exposed from the third element obverse surface 30*a*, the second wires 72 may be joined to the fourth pads 35 instead of the second wiring members 422, as shown in FIGS. 17 and 18. In the example shown in FIGS. 17 and 18, the substrate wiring 42 does not include the second wiring members 422 as the second wiring members 422 are not necessary. The fourth pads 35 are electrically connected to the lower wiring layer 33 via the connecting wires 36.

Figure 19:
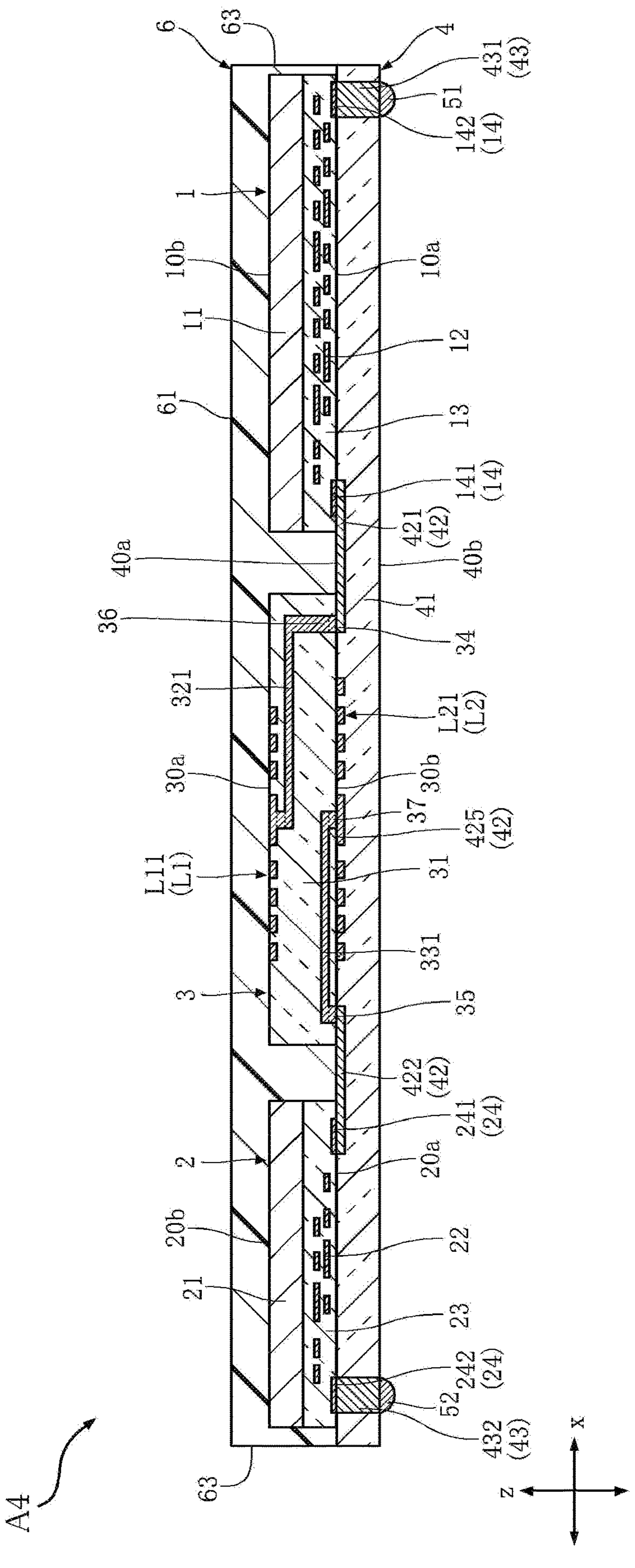
FIG. 19 is a cross-sectional view showing the semiconductor device according to a fourth embodiment.
Figure 20:
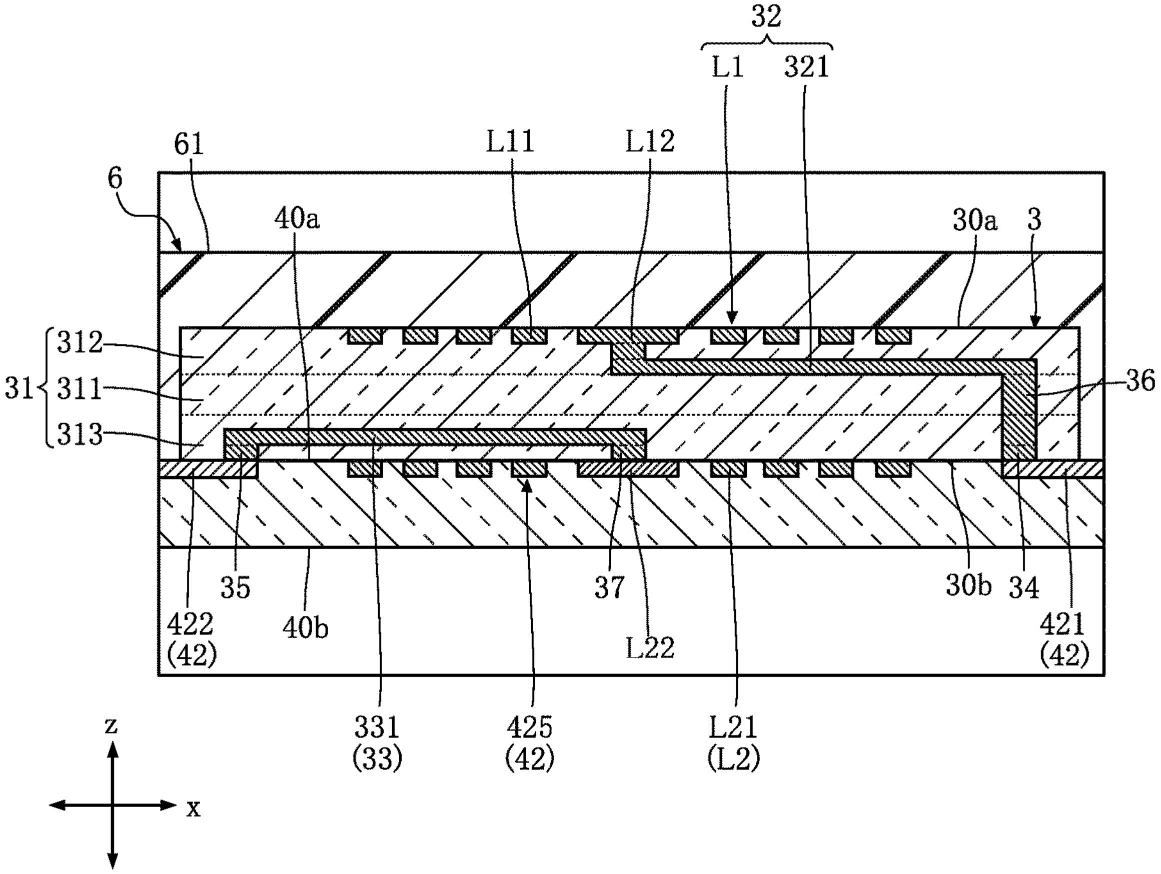
FIG. 20 is a partially enlarged cross-sectional view showing a portion (near the insulating element) of FIG. 19.
Figure 21:
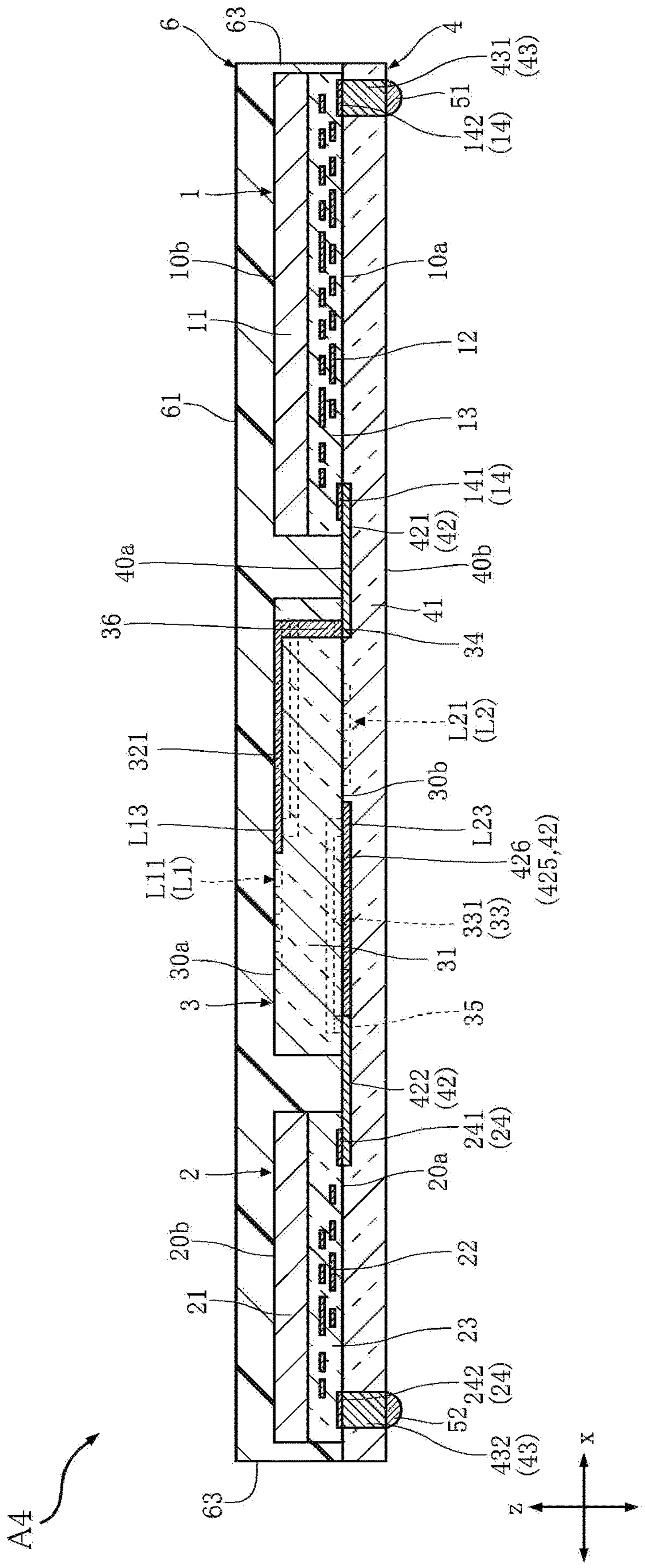
FIG. 21 is a cross-sectional view showing the semiconductor device according to the fourth embodiment, and corresponds to the cross-section in FIG. 11.

FIGS. 19 to 21 show a semiconductor device A4 according to a fourth embodiment. As shown in these figures, the semiconductor device A4 is different from the semiconductor device A1 mainly in the following points. In the semiconductor device A4, the second coil L2 is formed in the support substrate 4.

As shown in FIGS. 19 to 21, the substrate wiring 42 in the semiconductor device A4 further includes a fifth wiring member 425. The fifth wiring member 425 includes the second coil L2 and a lead wire 426. As in each of the semiconductor devices A1 to A3, the second coil L2 has the winding portions L21. As shown in FIG. 21, the lead wire 426 connects each of the outer ends L23 to one of the second wiring members 422, for example. In this regard, the second wiring member 422 and the lead wire 426 may be formed integrally.

As shown in FIG. 20, the insulating element 3 in the semiconductor device A4 further includes sixth pads 37. The sixth pads 37 are joined to the inner ends L22 of the second coil L2. The sixth pads 37 are electrically connected to the fourth pads 35 by the lead wires 331 of the lower wiring layer 33.

Similarly to the semiconductor devices A1 to A3, the semiconductor device A4 is configured such that the first circuit including the first semiconductor element 1 and the second circuit including the second semiconductor element 2 are insulated from each other by the base member 41. In other words, similarly to the semiconductor devices A1 to A3, the semiconductor device A4 can also suppress a decrease in the dielectric strength even when the semiconductor device A4 is downsized. Furthermore, the semiconductor device A4 has advantages similar to each of the semiconductor devices A1 to A3 owing to its common configuration with each of the semiconductor devices A1 to A3.

Figure 22:
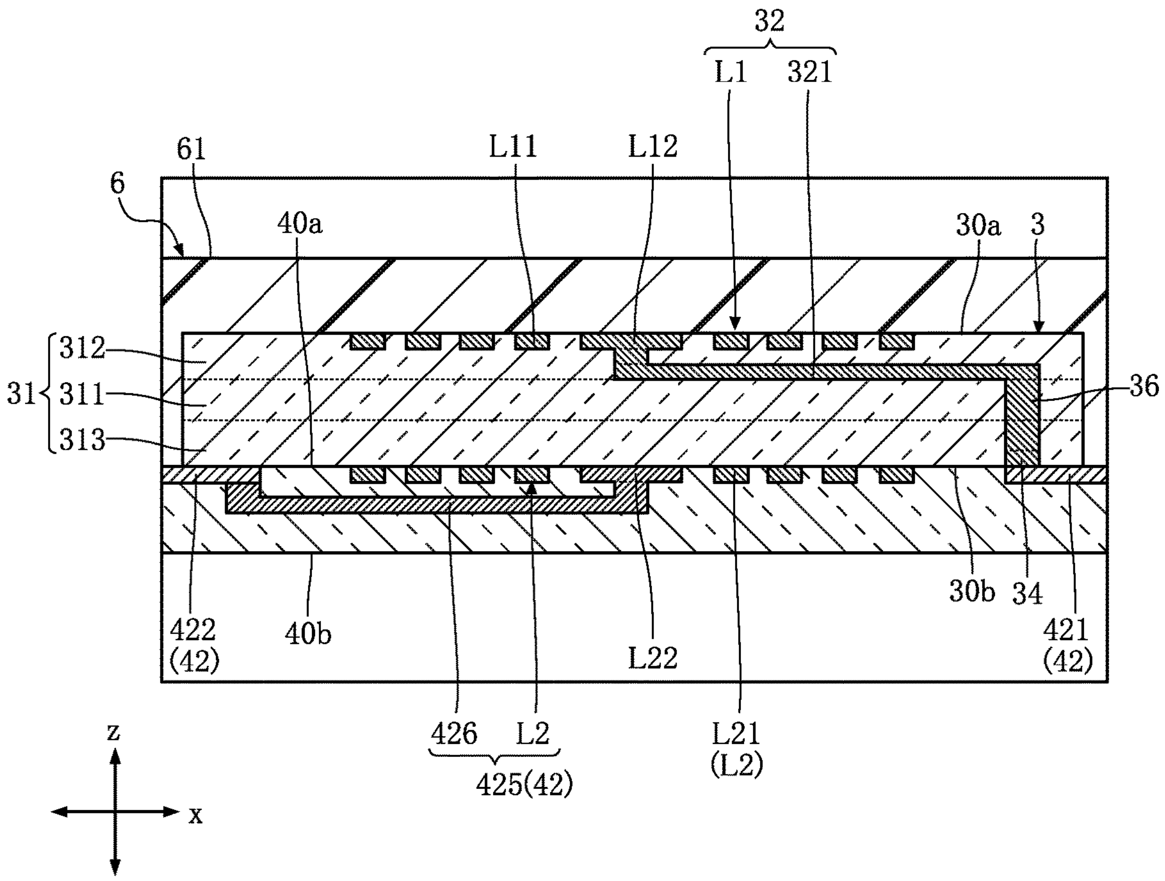
FIG. 22 is an enlarged cross-sectional view showing a main part of the semiconductor device according to a variation of the fourth embodiment.

In the semiconductor device A4 shown in FIGS. 19 to 21, each inner end L22 of the second coil L2 is electrically connected to one of the second wiring members 422 by the lower wiring layer 33 (each lead wire 331) of the insulating element 3. However, unlike this configuration, each of the inner ends L22 may be connected to one of the second wiring members 422 by the fifth wiring member 425 (the lead wire 426) as shown in FIG. 22.

Figure 23:
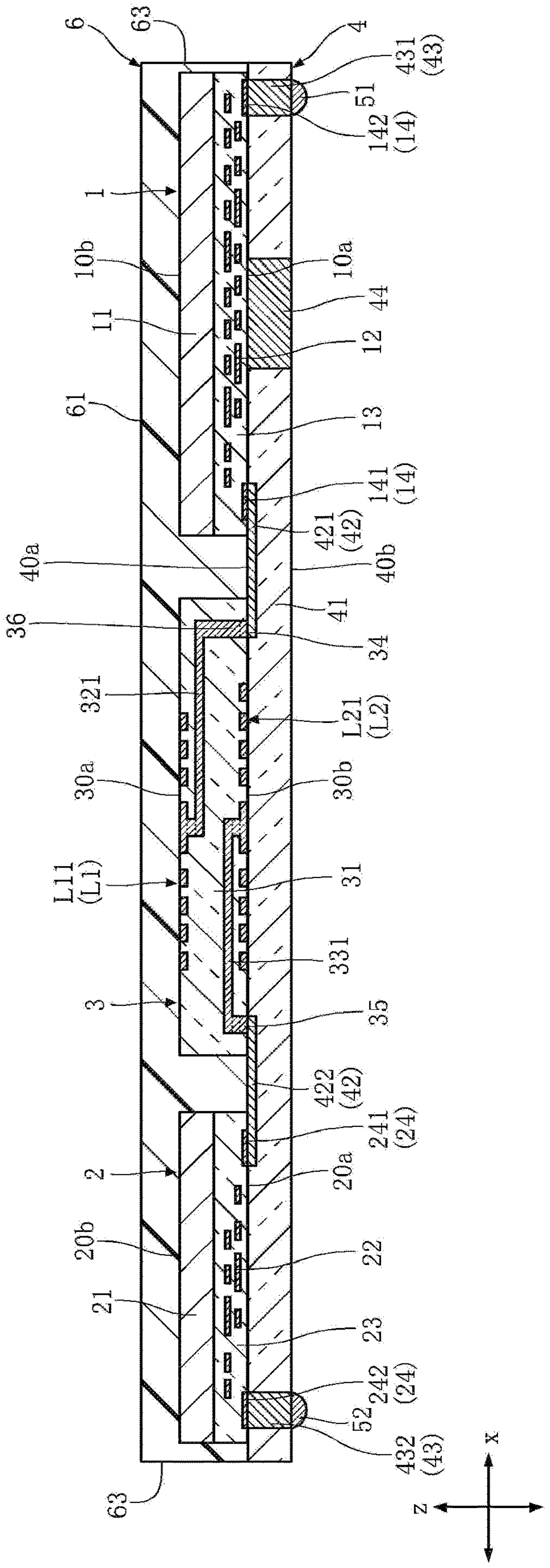
FIG. 23 is a cross-sectional view showing a semiconductor device according to a variation, and corresponds to the cross section in FIG. 7.

In each of the semiconductor devices A1 to A4 according to the first to fourth embodiments, the support substrate 4 may further include a heat dissipator 44. FIG. 23 shows an example where the semiconductor device A1 is provided with the heat dissipator 44.

As shown in FIG. 23, the heat dissipator 44 penetrates through the base member 41 in the thickness direction z. The heat dissipator 44 may be formed under the first semiconductor element 1 in the thickness direction. In other words, the heat dissipator 44 may be formed in the area overlapping with the first semiconductor element 1 in plan view. Note that the area where the heat dissipator 44 is formed is not particularly limited. However, the heat dissipator 44 should be formed to avoid at least the first wiring members 421 (and the third wiring members 423, if any). As with the through wires 43, the heat dissipator 44 may be made of Cu or a Cu alloy.

According to the semiconductor device shown in FIG. 23, the heat dissipator 44 can release heat from the first semiconductor element 1, thereby enhancing the dissipation of heat from the first semiconductor element 1.

In the example shown in FIG. 23, the heat dissipator 44 is arranged in the area overlapping with the first semiconductor element 1 in plan view. Alternatively, the heat dissipator 44 may be formed under the second semiconductor element 2 in the thickness direction z. In other words, the heat dissipator 44 may be formed in the area overlapping with the second semiconductor element 2 in plan view. In this case, the heat dissipator 44 can release heat from the second semiconductor element 2, thereby enhancing the dissipation of heat from the second semiconductor element 2. However, in the example where the source voltage applied to the first semiconductor element 1 is higher than the source voltage applied to the second semiconductor element 2, the amount of heat generated by the first semiconductor element 1 is higher than the amount of heat generated by the second semiconductor element 2. In this case, it is preferable that the heat dissipator 44 be arranged under the first semiconductor element 1. Alternatively, a plurality of heat dissipators 44 may be provided in the support substrate 4, and each of the heat dissipators 44 may be formed under either the first semiconductor element 1 or the second semiconductor element 2 in the thickness direction z.

Figure 24:
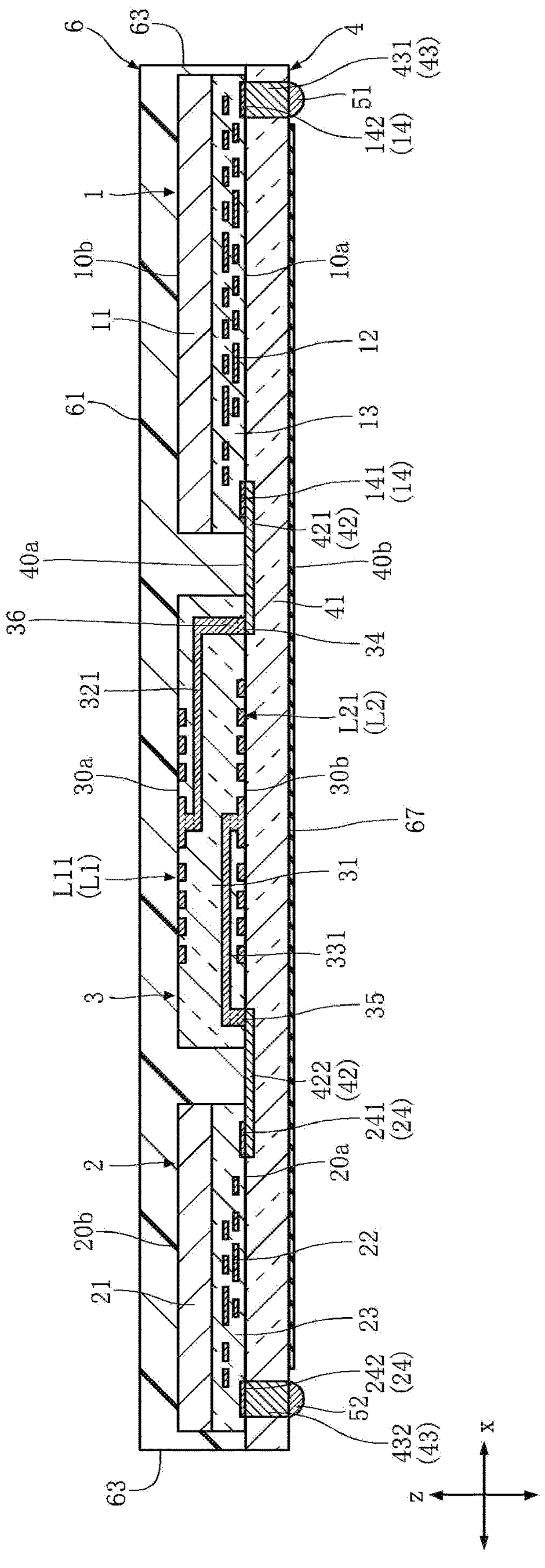
FIG. 24 is a cross-sectional view showing a semiconductor device according to a variation, and corresponds to the cross section in FIG. 7.

Each of the semiconductor devices A1 to A4 according to the first to fourth embodiments may further include a resin member 67. FIG. 24 shows a variation where the semiconductor device A1 is provided with the resin member 67.

As shown in FIG. 24, the resin member 67 is formed on the terminal surface **40*b* of the support substrate 4. The resin member 67 is arranged between the first external terminals 51 and the second external terminals 52 in the first direction x, for example. The resin member 67** is made of an insulating resin material such as an epoxy resin, a polyimide resin, or a phenolic resin.

In the semiconductor device shown in FIG. 24, the resin member 67 protects the terminal surface **40*b* of the base member 41. This allows the semiconductor device to suppress scratches on the base member 41. Furthermore, according to the semiconductor device, the resin member 67 serves as a stiffener for the base member 41 to suppress cracks in the base member 41**.

Figure 25:
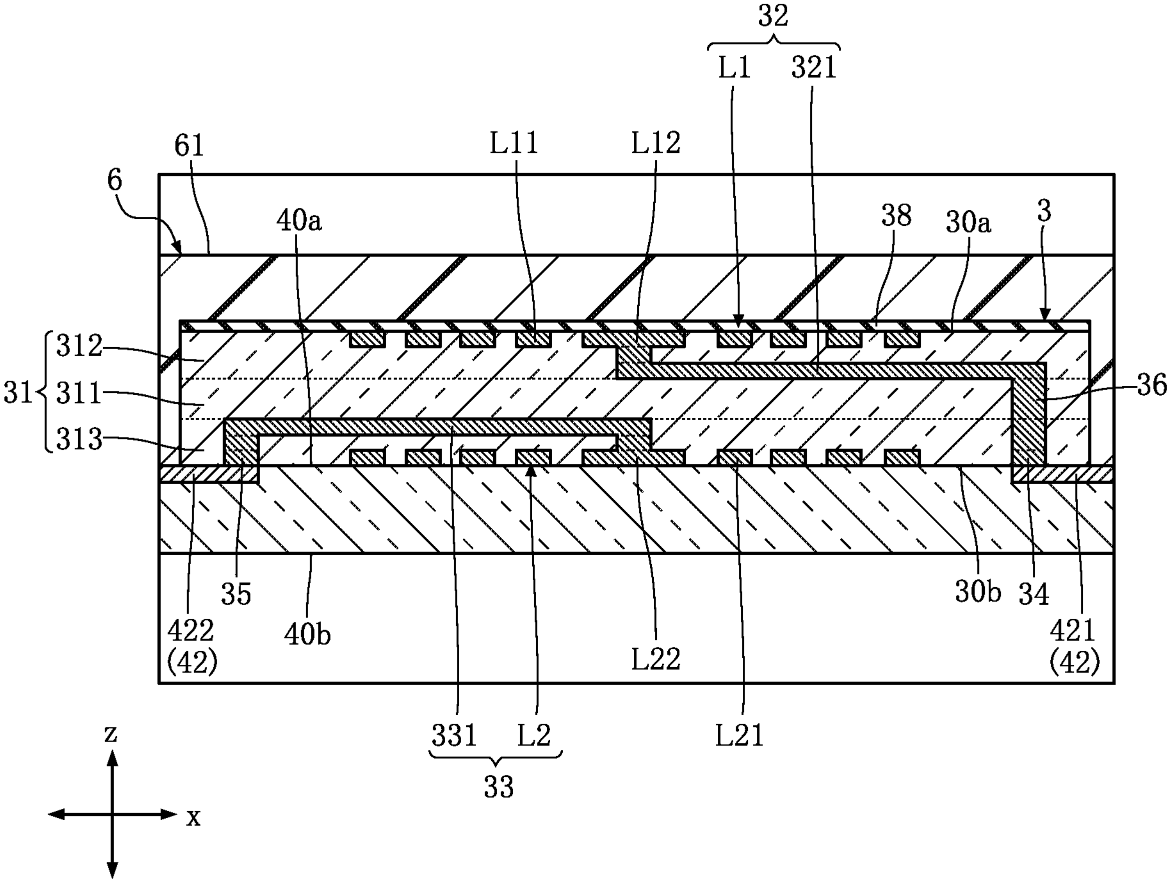
FIG. 25 is a cross-sectional view showing a main part of an insulating element according to a variation, and corresponds to the cross section in FIG. 10.

Each of the semiconductor devices A1 to A4 according to the first to fourth embodiments may further include a passivation film 38 covering a portion of the insulating element 3. FIG. 25 shows an example where the insulating element 3 of the semiconductor device A1 is provided with the passivation film 38.

As shown in FIG. 25, the passivation film 38 may cover the upper surface (the third element obverse surface **30*a*) of the insulating element 3. In the case where the third pads 34 and/or the fourth pads 35 are provided on the third element obverse surface 30*a* (see the example configuration shown in FIG. 16 or 18), the passivation film 38 is formed to expose the third pads 34 and/or the fourth pads 35. Unlike the configuration shown in FIG. 25, the passivation film 38 may cover the side surfaces (the surfaces facing in the first direction x and the surfaces facing in the second direction y) of the insulating element 3, as well as the third element obverse surface 30*a*. The passivation film 38** is made of polyimide, for example.

According to the semiconductor device shown in FIG. 25, the passivation film 38 can protect the first coil L1 exposed from the third element obverse surface **30*a***.

Figure 26:
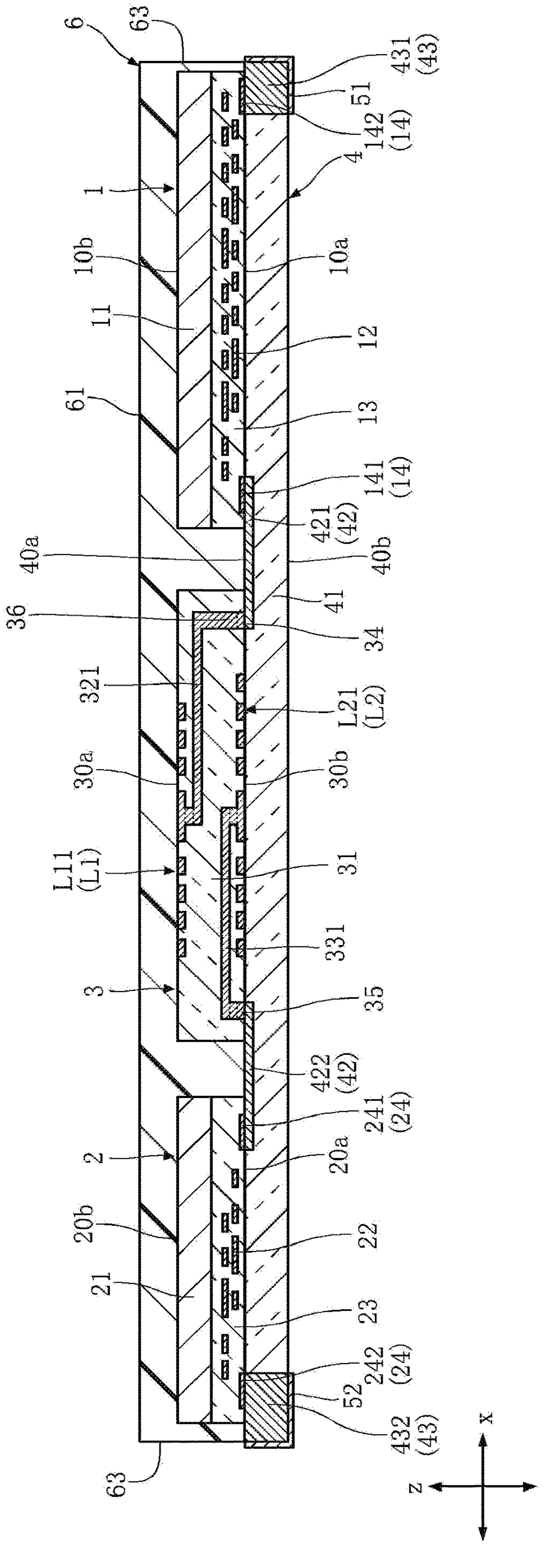
FIG. 26 is a cross-sectional view showing a semiconductor device according to a variation, and corresponds to the cross section in FIG. 7.

In each of the semiconductor devices A1 to A4 according to the first to fourth embodiment, the first external terminals 51 and the second external terminals 52 may be formed on side surfaces of the semiconductor device, as well as on the reverse surface thereof. FIG. 26 shows an example where, in the semiconductor device A1, the first external terminals 51 and the second external terminals 52 are also formed on side surfaces (the surfaces facing in the first direction x) of the base member 41.

Figure 27:
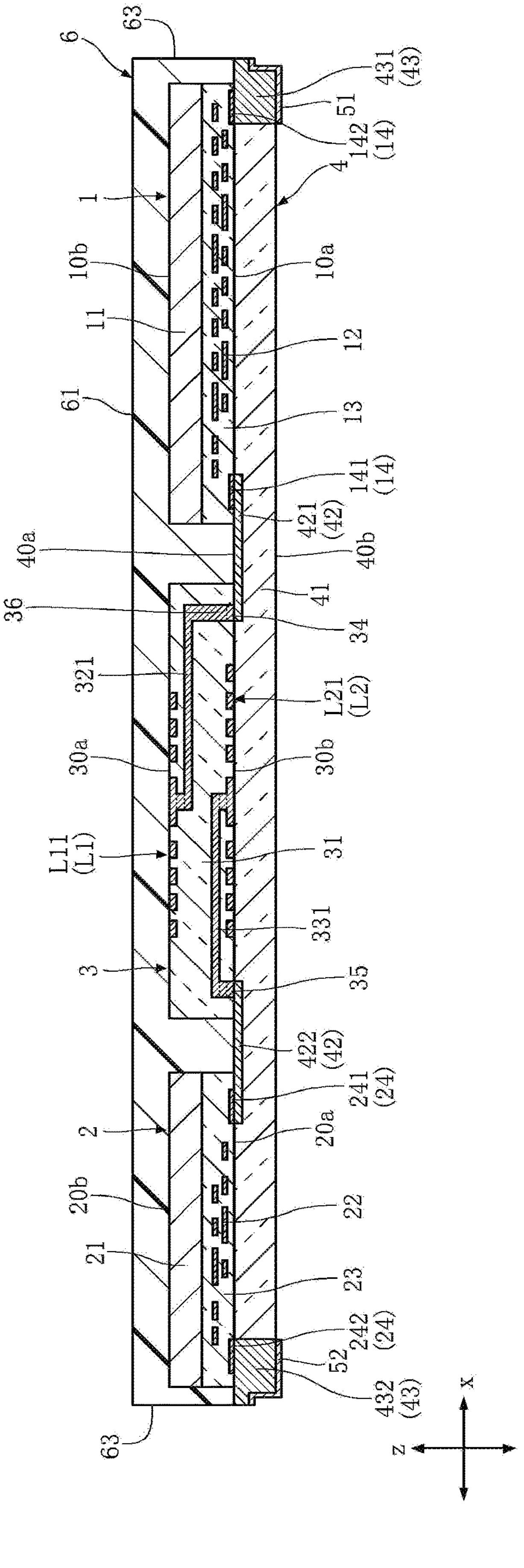
FIG. 27 is a cross-sectional view showing a semiconductor device according to a variation, and corresponds to the cross section in FIG. 7.

In the semiconductor device shown in FIG. 26, each of the through wires 43 is formed up to a side surface of the base member 41 and exposed from the side surface. As a result, each of the through wires 43 has a surface exposed from one of the side surfaces of the base member 41, and either a first external terminal 51 or a second external terminal 52 is formed on the exposed surface. Furthermore, in such a modification, each of the through wires 43 may have a recessed corner located outward in the first direction x and downward in the thickness direction z, as shown in FIG. 27. Such a semiconductor device as shown in FIG. 27 facilitates an inspection of a mounted state when the semiconductor device is mounted on a circuit board.

Each of the first embodiment to the fourth embodiment has given an example where the first semiconductor element 1, the second semiconductor element 2, and the insulating element 3 are directly joined to the support substrate 4. However, the present disclosure is not limited to this example, and the first semiconductor element 1, the second semiconductor element 2, and the insulating element 3 may be joined to the support substrate 4 by a conductive bonding member such as solder, a metal paste material, or a sintered metal.

In each of the first embodiment to the fourth embodiment, the first semiconductor element 1 is a drive element and the second semiconductor element 2 is a control element. Instead of this example, however, the first semiconductor element 1 may be a control element and the second semiconductor element 2 may be a drive element.

Figure 28:
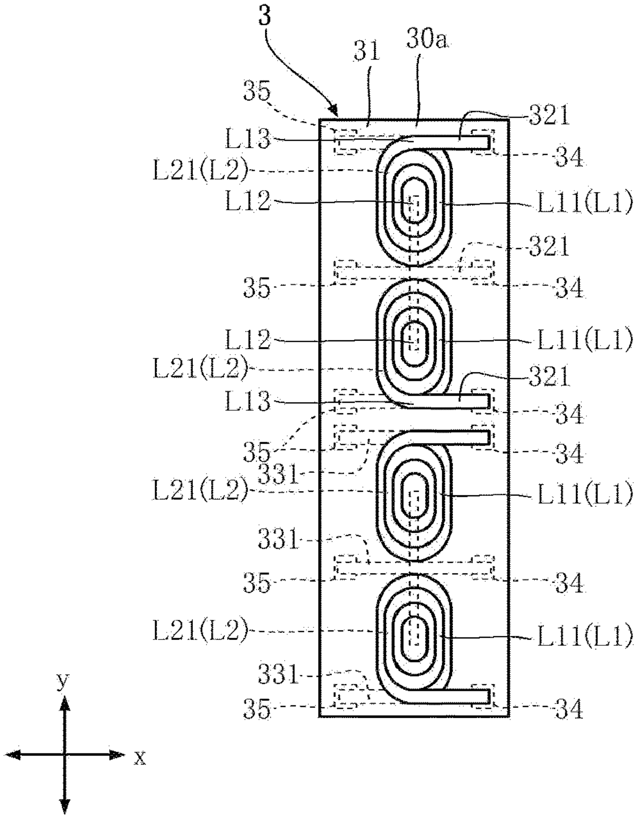
FIG. 28 is a plan view showing an example configuration of an insulating element (a first coil and a second coil) according to a variation.
Figure 29:
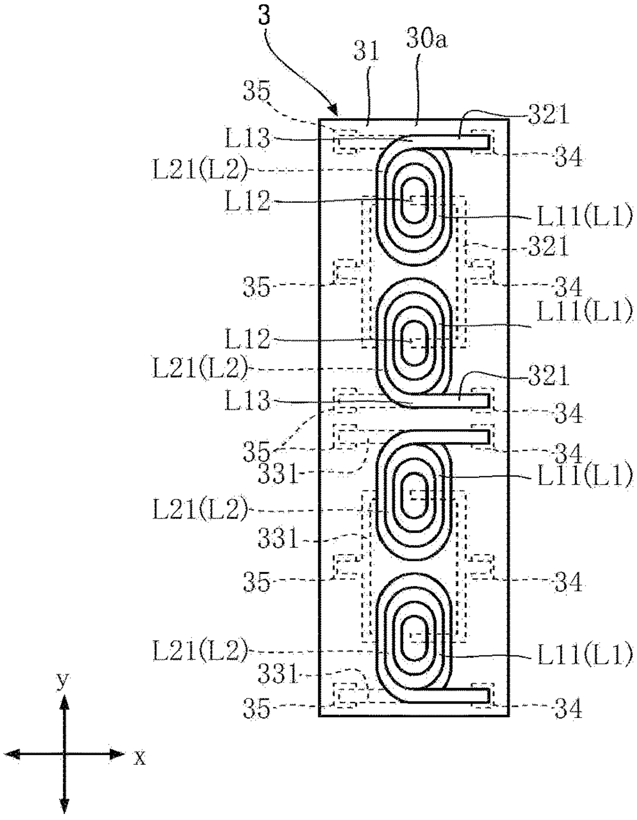
FIG. 29 is a plan view showing an example configuration of an insulating element (a first coil and a second coil) according to a variation.
Figure 30:
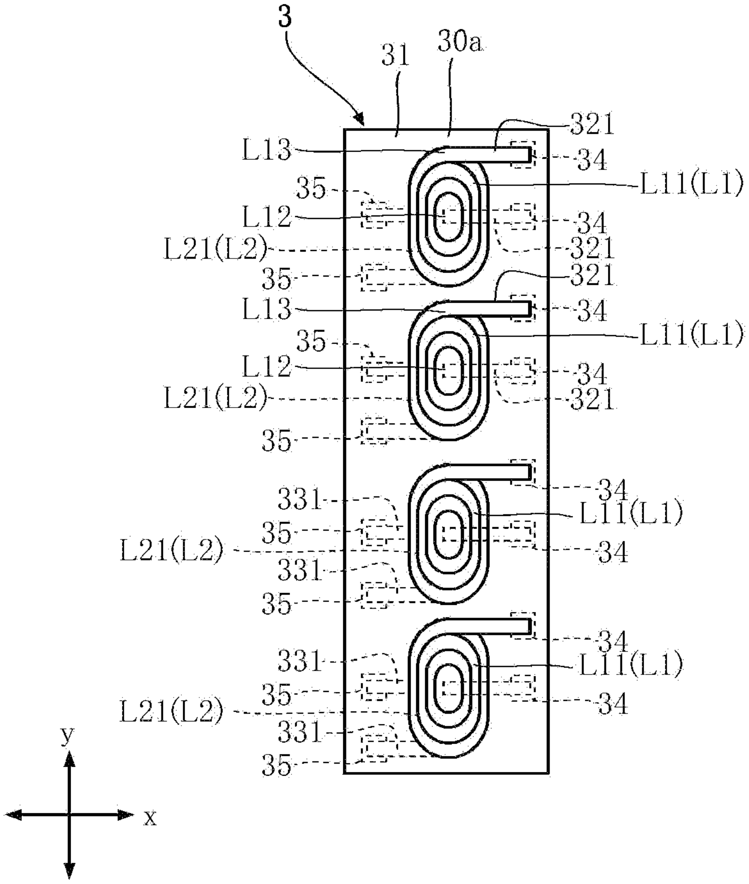
FIG. 30 is a plan view showing an example configuration of an insulating element (a first coil and a second coil) according to a variation.

In each of the semiconductor devices A1 to A4 according to the first to fourth embodiments, the first coil L1 and the second coil L2 may have any of the configurations as shown in FIGS. 28 to 30. FIGS. 28 to 30 each show the first coil L1 and the second coil L2 according to a variation. Although FIGS. 28 to 30 mainly show the configurations of the first coil L1 according to variations, the same configurations apply to the second coil L2.

In each of the semiconductor devices A1 to A4, the first coil L1 is such that the outer ends L13 of two winding portions L11 are electrically connected to each other by a lead wire 321. In contrast, in the examples of FIGS. 28 and 29, the first coil L1 is such that the inner ends L12 of two winding portions L11 are electrically connected to each other by a lead wire 321. The example shown in FIG. 28 is different from the example shown in FIG. 29 in the shape of each lead wire 321, but the relationships of electrical connection in these examples are the same. In the example shown in FIG. 30, four winding portions L11 of the first coil L1 are electrically independent from each other, and neither the inner ends L12 nor the outer ends L13 of two winding portions L11 are electrically connected to each other by a lead wire 321. Similarly, in each of the semiconductor devices A1 to A4, the second coil L2 is such that the outer ends L23 of two winding portions L21 are electrically connected to each other by a lead wire 331. In contrast, in the examples of FIGS. 28 and 29, the second coil L2 is such that the inner ends L22 of two winding portions L21 are electrically connected to each other by a lead wire 331. The example shown in FIG. 28 is different from the example shown in FIG. 29 in the shape of each lead wire 331, but the relationships of electrical connection in these examples are the same. In the example shown in FIG. 30, four winding portions L21 of the second coil L2 are electrically independent from each other, and neither the inner ends L22 nor the outer ends L23 of two winding portions L21 are electrically connected to each other by a lead wire 331.

The semiconductor device according to the present disclosure is not limited to those in the above embodiments. Various design changes can be made to the specific configurations of the elements of the semiconductor device of the present disclosure. For example, the present disclosure includes the embodiments described in the following clauses.

Clause 1.

A semiconductor device comprising:
- a first semiconductor element;
- a second semiconductor element;
- an insulating element including a first coil;
- a second coil magnetically coupled to the first coil; and
- a support substrate on which the first semiconductor element and the second semiconductor element are mounted,
- wherein the support substrate includes an insulating base member, and a substrate wiring formed on the base member,
- the substrate wiring includes a first wiring member electrically interposed between the first semiconductor element and the first coil, and a second wiring member electrically interposed between the second semiconductor element and the second coil,
- the second coil is arranged between the first coil and the base member, and
- the insulating element is supported by the support substrate.

Clause 2.

The semiconductor device according to clause 1,
- wherein the first semiconductor element is a drive element for driving a switching element,
- the second semiconductor element is a control element for controlling the drive of the switching element, and
- the drive element requires a higher voltage than the control element.

Clause 3.

The semiconductor device according to clause 1 or 2,
- wherein the support substrate has a mounting surface on which the first semiconductor element, the second semiconductor element, and the insulating element are mounted,
- the mounting surface faces in one sense of a thickness direction of the support substrate, and
- a portion of each of the base member and the substrate wiring is exposed from the mounting surface.

Clause 4.

The semiconductor device according to clause 3, wherein the base member is made of glass.

Clause 5.

The semiconductor device according to clause 3 or 4,
- wherein the first semiconductor element has a first element obverse surface and a first element reverse surface that face away from each other in the thickness direction, and includes a first substrate, a first wiring layer, a first insulating layer, and a first pad,
- the first substrate has a first functional surface on which a first functional circuit is formed,
- the first wiring layer is electrically connected to the first functional circuit, and is formed on the first functional surface,
- the first insulating layer covers the first wiring layer, and is formed on the first functional surface, the first pad is electrically connected to the first wiring layer, and the first insulating layer and the first pad are exposed from the first element obverse surface.

Clause 6.

The semiconductor device according to clause 5, wherein the first element obverse surface faces the mounting surface in the thickness direction, and the first semiconductor element and the support substrate are such that the first pad and the first wiring member are directly joined to each other, and that the first insulating layer and the base member are directly joined to each other.

Clause 7.

The semiconductor device according to clause 5 or 6, wherein the first insulating layer is made of glass.

Clause 8.

The semiconductor device according to any of clauses 3 to 7, wherein the second semiconductor element has a second element obverse surface and a second element reverse surface that face away from each other in the thickness direction, and includes a second substrate, a second wiring layer, a second insulating layer, and a second pad, the second substrate has a second functional surface on which a second functional circuit is formed, the second wiring layer is electrically connected to the second functional circuit, and is formed on the second functional surface, the second insulating layer covers the second wiring layer, and is formed on the second functional surface, the second pad is electrically connected to the second wiring layer, and the second insulating layer and the second pad are exposed from the second element obverse surface.

Clause 9.

The semiconductor device according to clause 8, wherein the second element obverse surface faces the mounting surface in the thickness direction, and the second semiconductor element and the support substrate are such that the second pad and the second wiring member are directly joined to each other, and that the second insulating layer and the base member are directly joined to each other.

Clause 10.

The semiconductor device according to clause 8 or 9, wherein the second insulating layer is made of glass.

Clause 11.

The semiconductor device according to any of clauses 3 to 10, wherein the insulating element includes the second coil and a third insulating layer, and at least a portion of the third insulating layer is provided between the first coil and the second coil in the thickness direction.

Clause 12.

The semiconductor device according to clause 11, wherein the insulating element has a third element obverse surface and a third element reverse surface that face away from each other in the thickness direction, the third element reverse surface faces the mounting surface in the thickness direction, the first coil is arranged on the third element obverse surface, and the second coil is arranged on the third element reverse surface.

Clause 13.

The semiconductor device according to clause 12, wherein the insulating element includes a third pad connected to the first coil, and a fourth pad connected to the second coil, the third pad, the fourth pad, and the third insulating layer are exposed from the third element reverse surface, and the insulating element and the support substrate are such that the third pad and the first wiring member are directly joined to each other, the fourth pad and the second wiring member are directly joined to each other, and the third insulating layer and the base member are directly joined to each other.

Clause 14.

The semiconductor device according to any of clauses 11 to 13, wherein the third insulating layer is made of glass.

Clause 15.

The semiconductor device according to any of clauses 3 to 14, wherein the support substrate includes a heat dissipator that is arranged in an area overlapping with the first semiconductor element as viewed in the thickness direction, and that penetrates through the base member in the thickness direction.

Clause 16.

The semiconductor device according to any of clauses 3 to 15, further comprising a first external terminal electrically connected to the first semiconductor element, and a second external terminal electrically connected to the second semiconductor element, wherein the support substrate has a terminal surface that faces away from the mounting surface in the thickness direction, and on which the first external terminal and the second external terminal are arranged.

Clause 17.

The semiconductor device according to clause 16, wherein the substrate wiring includes a third wiring member electrically interposed between the first semiconductor element and the first external terminal, and a fourth wiring member electrically interposed between the second semiconductor element and the second external terminal, the first external terminal is arranged outside the first semiconductor element as viewed in the thickness direction, and the second external terminal is arranged outside the second semiconductor element as viewed in the thickness direction.

Clause 18.

The semiconductor device according to clause 17, further comprising an insulating resin member that is formed on the terminal surface, and that is located between the first external terminal and the second external terminal as viewed in the thickness direction.

Clause 19.

The semiconductor device according to any of clauses 3 to 18, wherein the first coil and the second coil are located between the first semiconductor element and the second semiconductor element as viewed in the thickness direction.

Clause 20.

The semiconductor device according to any of clauses 3 to 19, wherein each of the first coil and the second coil includes two winding portions wound on a plane perpendicular to the thickness direction, and each of the two winding portions in each of the first coil and the second coil has a current input end and a current output end, and the current input ends or the current output ends of the two winding portions are connected to each other.

REFERENCE NUMERALS

A1-A4: Semiconductor device L1: First coil
L11: Winding portion
L12: Inner end L13: Outer end L2: Second coil
L21: Winding portion L22: Inner end L23: Outer end
1: First semiconductor element
10*a*: First element obverse surface
10*b*: First element reverse surface 11: First substrate
11*a*: First functional surface 12: First wiring layer
13: First insulating layer 14: First pad
141, 142: Electrode
2: Second semiconductor element
20*a*: Second element obverse surface
20*b*: Second element reverse surface
21: Second substrate
21*a*: Second functional surface 22: Second wiring layer
23: Second insulating layer 24: Second pad
241, 242: Electrode 3: Insulating element
30*a*: Third element obverse surface
30*b*: Third element reverse surface
31: Third insulating layer 311: Intermediate portion
312: Upper covering portion
313: Lower covering portion 32: Upper wiring layer
321: Lead wire
33: Lower wiring layer 331: Lead wire 34: Third pad
35: Fourth pad 36: Connecting wire 37: Sixth pad
38: Passivation film 4: Support substrate
40*a*: Mounting surface
40*b*: Terminal surface 41: Base member 42: Substrate wiring
421: First wiring member 422: Second wiring member
423: Third wiring member
424: Fourth wiring member 425: Fifth wiring member
426: Lead wire 43: Through wire
431: First penetrating member
432: Second penetrating member
44: Heat dissipator 51: First external terminal
52: Second external terminal
6: Sealing resin 61: Top surface 63: First side surface
64: Second side surface 67: Resin member
7: Connecting member 71: First wire
72: Second wire 73: Third wire 74: Fourth wire

The invention claimed is:

1. A semiconductor device comprising:
a first semiconductor element;
a second semiconductor element;
an insulating element including a first coil and a third insulating layer;
a second coil magnetically coupled to the first coil;
and a support substrate on which the first semiconductor element and the second semiconductor element are mounted,
wherein the support substrate includes an insulating base member, and a substrate wiring formed on the base member,
the substrate wiring includes a first wiring member electrically interposed between the first semiconductor element and the first coil, and a second wiring member electrically interposed between the second semiconductor element and the second coil,
the second coil is arranged between the first coil and the base member,
the insulating element is supported by the support substrate,
the insulating element has a third element obverse surface and a third element reverse surface that face away from each other in a thickness direction of the support substrate,
the insulating element includes a fourth pad connected to the second coil,
the fourth pad and the third insulating layer are exposed from the third element reverse surface, and
the insulating element and the support substrate are such that the fourth pad and the second wiring member are directly joined to each other, and the third insulating layer and the base member are directly joined to each other.

2. The semiconductor device according to claim 1,
wherein the first semiconductor element is a drive element for driving a switching element,
the second semiconductor element is a control element for controlling the drive of the switching element, and
the drive element requires a higher voltage than the control element.

3. The semiconductor device according to claim 1,
wherein the support substrate has a mounting surface on which the first semiconductor element, the second semiconductor element, and the insulating element are mounted,
the mounting surface faces in one sense of the thickness direction, and
a portion of each of the base member and the substrate wiring is exposed from the mounting surface.

4. The semiconductor device according to claim 3, wherein the base member is made of glass.

5. The semiconductor device according to claim 3,
wherein the first semiconductor element has a first element obverse surface and a first element reverse surface that face away from each other in the thickness direction, and includes a first substrate, a first wiring layer, a first insulating layer, and a first pad,
the first substrate has a first functional surface on which a first functional circuit is formed,
the first wiring layer is electrically connected to the first functional circuit, and is formed on the first functional surface,
the first insulating layer covers the first wiring layer, and is formed on the first functional surface,
the first pad is electrically connected to the first wiring layer, and
the first insulating layer and the first pad are exposed from the first element obverse surface.

6. The semiconductor device according to claim 5,
wherein the first element obverse surface faces the mounting surface in the thickness direction, and
the first semiconductor element and the support substrate are such that the first pad and the first wiring member are directly joined to each other, and that the first insulating layer and the base member are directly joined to each other.

7. The semiconductor device according to claim 5, wherein the first insulating layer is made of glass.

8. The semiconductor device according to claim 3,
wherein the second semiconductor element has a second element obverse surface and a second element reverse surface that face away from each other in the thickness direction, and includes a second substrate, a second wiring layer, a second insulating layer, and a second pad, the second substrate has a second functional surface on which a second functional circuit is formed, the second wiring layer is electrically connected to the second functional circuit, and is formed on the second functional surface, the second insulating layer covers the second wiring layer, and is formed on the second functional surface, the second pad is electrically connected to the second wiring layer, and the second insulating layer and the second pad are exposed from the second element obverse surface.

9. The semiconductor device according to claim 8, wherein the second element obverse surface faces the mounting surface in the thickness direction, and the second semiconductor element and the support substrate are such that the second pad and the second wiring member are directly joined to each other, and that the second insulating layer and the base member are directly joined to each other.

10. The semiconductor device according to claim 8, wherein the second insulating layer is made of glass.

11. The semiconductor device according to claim 3, wherein the insulating element includes the second coil, and at least a portion of the third insulating layer is provided between the first coil and the second coil in the thickness direction.

12. The semiconductor device according to claim 11, wherein the third element reverse surface faces the mounting surface in the thickness direction, the first coil is arranged on the third element obverse surface, and the second coil is arranged on the third element reverse surface.

13. The semiconductor device according to claim 12, wherein the insulating element includes a third pad connected to the first coil, the third pad is exposed from the third element reverse surface, and the insulating element and the support substrate are such that the third pad and the first wiring member are directly joined to each other.

14. The semiconductor device according to claim 11, wherein the third insulating layer is made of glass.

15. The semiconductor device according to claim 3, wherein the support substrate includes a heat dissipator that is arranged in an area overlapping with the first semiconductor element as viewed in the thickness direction, and that penetrates through the base member in the thickness direction.

16. The semiconductor device according to claim 3, further comprising a first external terminal electrically connected to the first semiconductor element, and a second external terminal electrically connected to the second semiconductor element, wherein the support substrate has a terminal surface that faces away from the mounting surface in the thickness direction, and on which the first external terminal and the second external terminal are arranged.

17. The semiconductor device according to claim 16, wherein the substrate wiring includes a third wiring member electrically interposed between the first semiconductor element and the first external terminal, and a fourth wiring member electrically interposed between the second semiconductor element and the second external terminal, the first external terminal is arranged outside the first semiconductor element as viewed in the thickness direction, and the second external terminal is arranged outside the second semiconductor element as viewed in the thickness direction.

18. The semiconductor device according to claim 17, further comprising an insulating resin member that is formed on the terminal surface, and that is located between the first external terminal and the second external terminal as viewed in the thickness direction.

19. The semiconductor device according to claim 3, wherein the first coil and the second coil are located between the first semiconductor element and the second semiconductor element as viewed in the thickness direction.

20. The semiconductor device according to claim 3, wherein each of the first coil and the second coil includes two winding portions wound on a plane perpendicular to the thickness direction, and each of the two winding portions in each of the first coil and the second coil has a current input end and a current output end, and the current input ends or the current output ends of the two winding portions are connected to each other.

* * * * *